(12) United States Patent
Chino et al.

(10) Patent No.: US 11,231,434 B2
(45) Date of Patent: Jan. 25, 2022

(54) SENSOR UNIT, VEHICLE POSITIONING DEVICE, AND VEHICLE

(71) Applicant: Seiko Epson Corporation, Tokyo (JP)

(72) Inventors: Taketo Chino, Hokuto (JP); Yoshikuni Saito, Suwa (JP)

(73) Assignee: Seiko Epson Corporation

( * ) Notice: Subject to any disclaimer, the term of this patent is extended or adjusted under 35 U.S.C. 154(b) by 394 days.

(21) Appl. No.: 16/362,818

(22) Filed: Mar. 25, 2019

(65) Prior Publication Data

US 2019/0293674 A1 Sep. 26, 2019

(30) Foreign Application Priority Data

Mar. 26, 2018 (JP) .............................. JP2018-057651

(51) Int. Cl.
| | |
|---|---|
| *H05K 1/11* | (2006.01) |
| *G01P 1/02* | (2006.01) |
| *H05K 1/18* | (2006.01) |
| *H05K 5/00* | (2006.01) |
| *G05D 1/02* | (2020.01) |

(52) U.S. Cl.
CPC .............. *G01P 1/023* (2013.01); *H05K 1/111* (2013.01); *H05K 1/181* (2013.01); *H05K 5/0008* (2013.01); *H05K 5/0052* (2013.01); *G05D 1/021* (2013.01); *H05K 2201/09027* (2013.01); *H05K 2201/09036* (2013.01); *H05K 2201/09045* (2013.01); *H05K 2201/09063* (2013.01); *H05K 2201/10151* (2013.01)

(58) Field of Classification Search
CPC ... H05K 1/11; H05K 1/14; H05K 1/18; H05K 1/111; H05K 1/181–1/187; H05K 5/00; H05K 5/0008; H05K 5/0052; H05K 2201/09036; H05K 2201/09063; H05K 2201/09045; H05K 2201/09027; G01P 15/18; G01P 15/125; G01P 19/43; G01P 19/5783
USPC ......... 361/752–759, 767–775, 803, 807–810
See application file for complete search history.

(56) References Cited

U.S. PATENT DOCUMENTS

| | | | | |
|---|---|---|---|---|
| 4,943,844 A | * | 7/1990 | Oscilowski | ......... H01L 23/5385 257/701 |
| 4,993,148 A | * | 2/1991 | Adachi | .................. H05K 1/021 174/252 |
| 5,233,873 A | * | 8/1993 | Mozgowiec | ............ G01P 1/023 73/497 |

(Continued)

FOREIGN PATENT DOCUMENTS

JP 2017-020829 A 1/2017

*Primary Examiner* — Tuan T Dinh
(74) *Attorney, Agent, or Firm* — Harness, Dickey & Pierce, P.L.C.

(57) ABSTRACT

A sensor unit includes a circuit board including, on a first surface, a plurality of electrode pads to which a plurality of mounting terminals of an inertial sensor are respectively attached via connecting members. The first surface of the circuit board includes an insulating layer provided on the outer side of the plurality of electrode pads in a plan view, includes, in a portion overlapping a center region further on the inner side than the mounting terminals of the inertial sensor in the plan view, a first region where the insulating layer is not provided, and includes, from the first region to the outer side of the inertial sensor in the plan view, a second region where the insulating layer is not provided.

19 Claims, 26 Drawing Sheets

(56) References Cited

U.S. PATENT DOCUMENTS

| | | | |
|---|---|---|---|
| 8,112,196 B2* | 2/2012 | Takayanagi | H05K 1/144 |
| | | | 701/36 |
| 9,554,453 B2* | 1/2017 | Hsiao | H05K 1/0206 |
| 9,704,725 B1* | 7/2017 | Kim | H01L 23/3157 |
| 2002/0140085 A1* | 10/2002 | Lee | H01L 25/16 |
| | | | 257/724 |
| 2003/0178708 A1* | 9/2003 | Minamio | H01L 23/3107 |
| | | | 257/666 |
| 2014/0347823 A1* | 11/2014 | Kinoshita | B23K 1/0016 |
| | | | 361/748 |
| 2015/0040666 A1* | 2/2015 | Saito | G01P 1/023 |
| | | | 73/514.01 |
| 2017/0191832 A1 | 7/2017 | Kinoshita et al. | |
| 2019/0320526 A1* | 10/2019 | Sato | H05K 1/0271 |

* cited by examiner

Related Art

SENSOR UNIT, VEHICLE POSITIONING DEVICE, AND VEHICLE

BACKGROUND

1. Technical Field

The present invention relates to a sensor unit, a vehicle positioning device, a portable electronic device, an electronic device, a vehicle, and a display device.

2. Related Art

A known sensor unit includes inertial sensors such as an acceleration sensor and an angular velocity sensor mounted on a substrate housed in a case. The sensor unit detects inertia based on a predetermined detection axis. For example, JP-A-2017-20829 describes an inertial measurement unit (IMU) in which a connector, an angular velocity sensor, an acceleration sensor, and the like are mounted on a substrate, the surface of which is protected by resist.

However, in the inertial measurement unit (the sensor unit) described in JP-A-2017-20829, foreign matters sometimes remain between the inertial sensor (the acceleration or the like) that is surface-mounted on the substrate and the substrate. As a consequence, temperature hysteresis is likely to occur in a bias signal (a detection output signal) because of the remaining foreign matters.

SUMMARY

A sensor unit according to an aspect of the invention includes: an inertial sensor; a circuit board including, on a first surface, a plurality of electrode pads to which a plurality of mounting terminals of the inertial sensor are respectively attached via connecting members; and a case, on an inside of which the circuit board is housed. The first surface of the circuit board includes an insulating layer provided on an outer side of the plurality of electrode pads in a plan view, includes, in a portion overlapping a center region further on an inner side than the mounting terminals of the inertial sensor in the plan view, a first region where the insulating layer is not provided, and includes, from the first region to an outer side of the inertial sensor in the plan view, a second region where the insulating layer is not provided.

In the sensor unit, it is preferable that recessed sections are provided in the first region and the second region of the first surface of the circuit board.

In the sensor unit, it is preferable that, in the circuit board, a through-hole piercing through the circuit board is provided in the first region.

In the sensor unit, it is preferable that the second region is provided between the electrode pads adjacent to each other.

In the sensor unit, it is preferable that a peripheral projecting section or an unconnected projecting section is provided between a center of the inertial sensor and the electrode pads in the plan view.

In the sensor unit, it is preferable that the peripheral projecting section or the unconnected projecting section is closer to the electrode pads side than the center side of the inertial sensor.

In the sensor unit, it is preferable that the peripheral projecting section or the unconnected projecting section is an insulating layer.

In the sensor unit, it is preferable that the inertial sensor has a square shape in the plan view, and the plurality of mounting terminals are disposed on an opposed pair of sides of the square shape.

In the sensor unit, it is preferable that the inertial sensor is an acceleration sensor.

A vehicle positioning device according to another aspect of the invention includes: the sensor unit; a receiving section configured to receive a satellite signal superimposed with position information from a positioning satellite; an acquiring section configured to acquire the position information of the receiving section on the basis of the received satellite signal; a computing section configured to compute a posture of a vehicle on the basis of inertial data output from the sensor unit; and a calculating section configured to calculate a position of the vehicle by correcting the position information on the basis of the computed posture.

A portable electronic device according to still another aspect of the invention includes: the sensor unit; a case in which the sensor unit is housed; a processing section housed in the case and configured to process output data from the sensor unit; a display section housed in the case; and a light transmissive cover closing an opening section of the case.

In the portable electronic device, it is preferable that the portable electronic device includes a satellite positioning system and measures a moving distance and a moving track of a user.

An electronic device according to still another aspect of the invention includes: the sensor unit; and a control section configured to perform control on the basis of a detection signal output from the sensor unit.

A vehicle according to still another aspect of the invention includes: the sensor unit; and a control section configured to perform control on the basis of a detection signal output from the sensor unit.

In the vehicle, it is preferable that the vehicle includes at least any one system of an engine system, a brake system, and a keyless entry system, and the control section controls the system on the basis of the detection signal.

A vehicle according to still another aspect of the invention includes: the sensor unit; and a control section configured to control at least any one of acceleration, braking, and steering on the basis of a detection signal detected by the sensor unit. Whether automatic driving is carried out or not is switched according to a change of the detection signal output from the sensor unit.

A display device according to still another aspect of the invention includes: a display section worn on a head of a user and configured to irradiate image light on eyes of the user; and the sensor unit. The sensor unit is located further on one side than a center of the head in a mounted state of the display device.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

An embodiment is explained below. The embodiment explained below does not unduly limit the scope of the invention described in the appended claims. Not all of components explained in the embodiment are essential constituent elements of the invention.

Sensor Unit

Overview of a Sensor Unit

Figure 1:
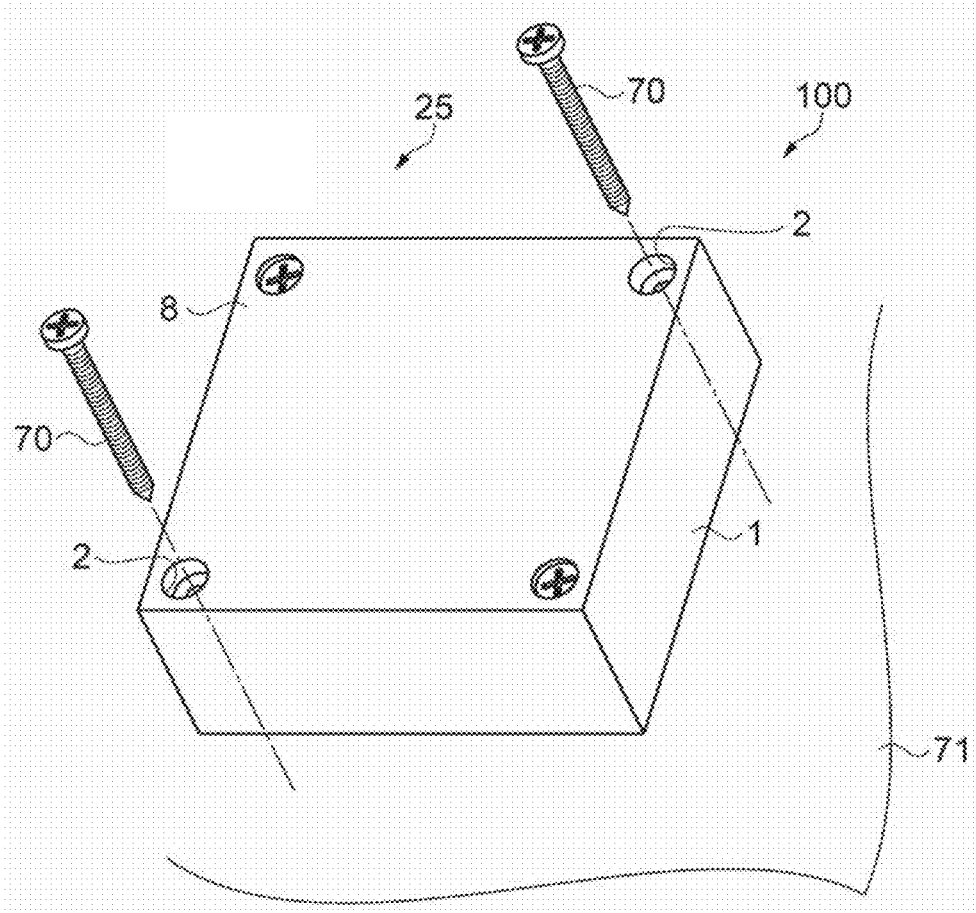
FIG. 1 is a perspective view showing a state in which a sensor unit according to an embodiment is fixed to a mounting surface.
Figure 2:
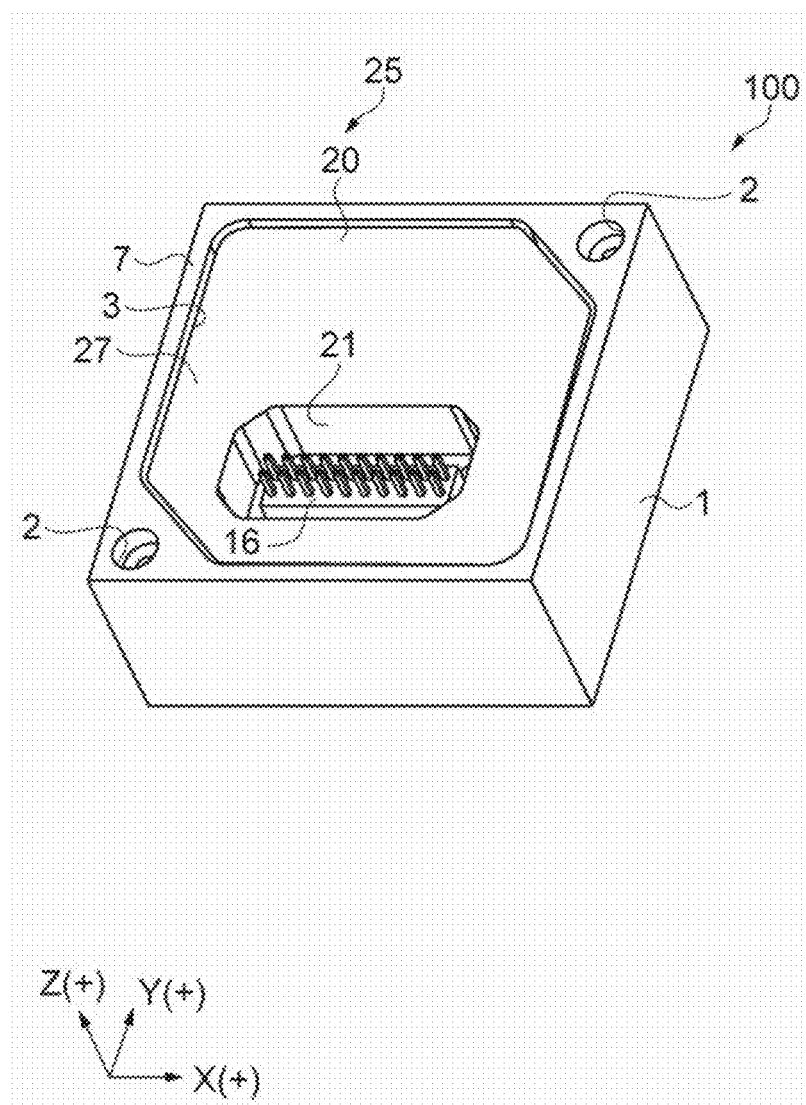
FIG. 2 is a perspective view showing an overview of the sensor unit viewed from the mounting surface side in FIG. 1.

First, an overview of a sensor unit is explained with reference to FIGS. 1 and 2. FIG. 1 is a perspective view showing a state in which a sensor unit according to the embodiment is fixed to a mounting surface. FIG. 2 is a perspective view showing the overview of the sensor unit viewed from the mounting surface side in FIG. 1.

As shown in FIG. 1, a sensor unit 100 is an inertial measurement unit (hereinafter, IMU) that detects postures and behaviors (inertial momentums) of vehicles (devices on which the sensor unit 100 is mounted) such as an automobile, an agricultural machine, a construction machine, a robot, and a drone. The sensor unit 100 functions as a so-called six-axis motion sensor including a three-axis acceleration sensor and a three-axis angular velocity sensor functioning as inertial sensors.

The sensor unit 100 is a rectangular parallelepiped that is substantially square in a planar shape. The length of one side of the square is approximately 3 cm and the thickness of the sensor unit 100 is approximately 1 cm. Screw holes 2 functioning as fixed sections are formed near vertexes in two places located in a diagonal direction of the square. The sensor unit 100 is used in a state in which two screws 70 are inserted through the screw holes 2 in the two places to fix the sensor unit 100 to a mounting surface 71 of a body (a device) on which the sensor unit 100 is mounted such as an automobile. The size described above is an example. The sensor unit 100 can be miniaturized to sizes mountable on, for example, an HMD (a head mounted display or a smartglass), a smartphone, and a digital camera according to selection of components and a design change. An opening on the opposite side of the mounting surface 71 of the sensor unit 100 is covered by a lid 8.

The sensor unit 100 adopts a characteristic package configuration for reducing noise vibration such as engine vibration of an automobile transmitted from the mounting surface 71. This configuration realizes reliability and stability of detection accuracy higher than those of the sensor unit in the past.

This characteristic package configuration is explained in detail below. This configuration is not limited to the IMU including the six-axis motion sensor and is applicable to any unit or device including an inertial sensor.

As shown in FIG. 2, an opening section 21 is formed on the surface of the sensor unit 100 viewed from the mounting surface side. A plug-type (male) connector 16 is disposed on the inside (the inner side) of the opening section 21. The connector 16 has a plurality of pins. The plurality of pins are disposed to extend in the lateral direction when viewed from a direction right opposed to FIG. 2. A socket-type (female) connector (not shown in FIG. 2) is connected to the connector 16 from the device on which the sensor unit 100 is mounted. A driving voltage of the sensor unit 100 and an electric signal such as detection data are transmitted and received between the connectors.

In the following explanation, the extending direction of the plurality of pins is represented as an X-axis direction. In other words, in the square shape of the sensor unit 100, an extending direction of a side that is the lateral direction when viewed from the direction right opposed to FIG. 2 is representing as the X-axis direction. An extending direction of a side in a direction orthogonal to the X-axis direction in the square shape is represented as a Y-axis direction. The thickness direction of the sensor unit 100 is represented as a Z-axis direction.

Configuration of the Sensor Unit

Figure 3:
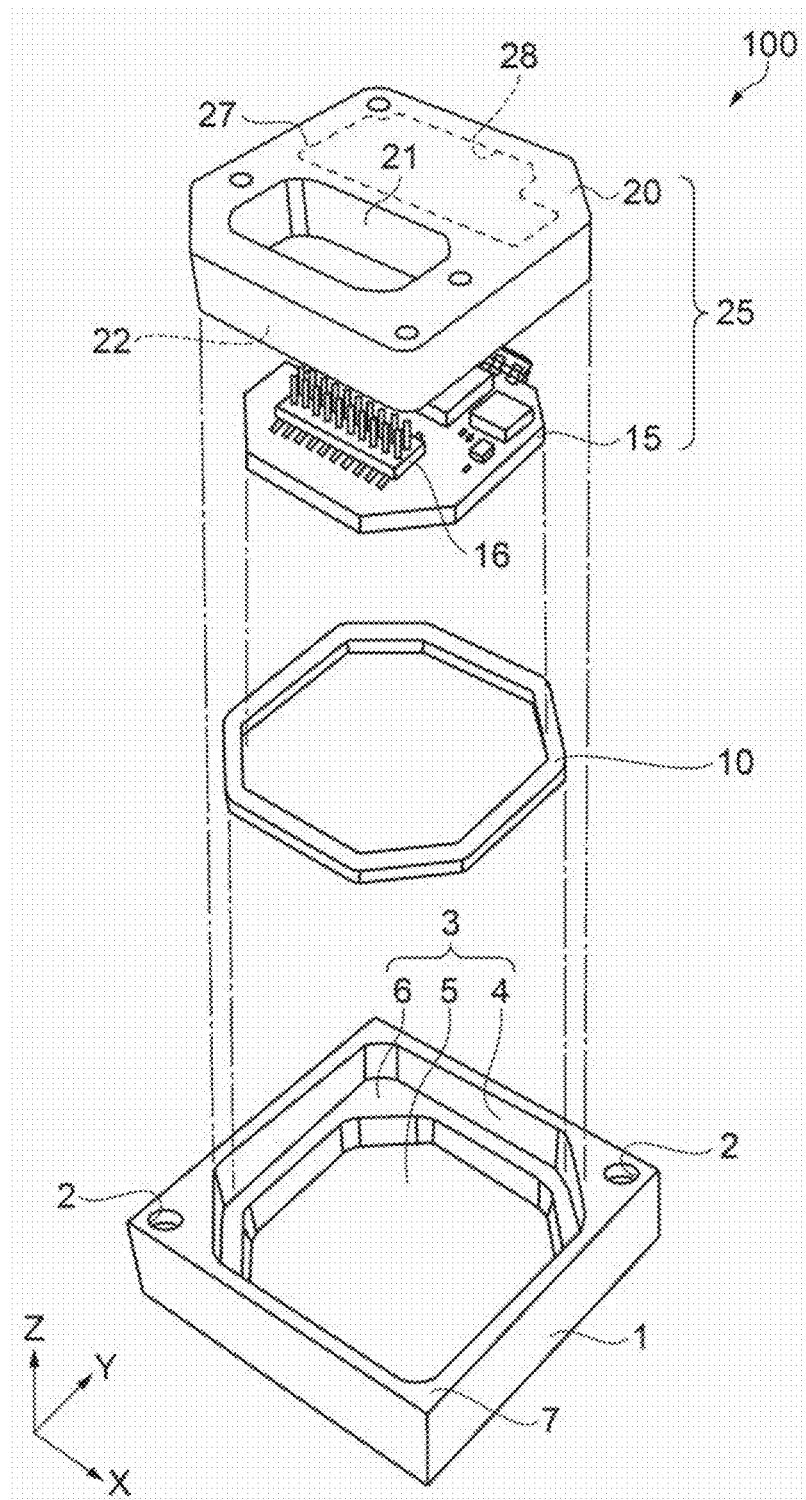
FIG. 3 is an exploded perspective view of the sensor unit viewed from the same direction as a direction in which the sensor unit is viewed in FIG. 2.

The configuration of the sensor unit is explained with reference to FIG. 3 in addition to FIGS. 1 and 2. FIG. 3 is an exploded perspective view of the sensor unit when viewed from the same direction as a direction as a direction in which the sensor unit is viewed in FIG. 2.

As shown in FIG. 3, the sensor unit 100 is configured from an outer case 1, a joining member (a buffering member) 10, a circuit board 15, an inner case 20, and the like. In other words, the circuit board 15 and the inner case 20 are fit (inserted) in this order on an inside 3 of the outer case 1 via the joining member (the buffering member) 10. A module configured from the circuit board 15 and the inner case 20 functioning as a case in which the circuit board 15 is housed is referred to as sensor module 25. To facilitate explanation, the parts are referred to as the outer case and the inner case. However, the parts may also be referred to as the first case and the second case.

The outer case 1 is a pedestal obtained by cutting aluminum into a box shape. The material of the outer case 1 is not limited to aluminum. Another kind of metal such as zinc or stainless steel, resin, or a composite material of metal and resin may be used. Like the overall shape of the sensor unit 100, the external shape of the outer case 1 is a rectangular parallelepiped that is substantially square in a planar shape. The screw holes 2 are respectively formed near vertexes in two places located in a diagonal direction of the square. Means for fixing the outer case 1 is not limited to the screw holes 2. For example, cutouts that can be screwed by screws may be formed (cutouts may be formed in outer case 1 corner portions of the screw holes 2) to screw the outer case 1. Alternatively, flanges (ears) may be formed on side surface of the outer case 1 and screwed. However, when the outer case 1 is screwed using the cutout holes in the former case as fixed sections, the screws deviate from the cutouts to be slant in the screwing if the cutouts of the cutout holes are opened wider than a screw diameter. The fixing of the screwing is likely to easily come off. The cutout hole portions of the outer case are likely to be deformed and shaved by the deviating screws. Therefore, when the cutout holes are provided as the fixed sections, it is desirable to form the cutouts of the cutout holes to be smaller than the diameter of screw heads that form a seating surface.

The external shape of the outer case 1 is a rectangular parallelepiped and is a lidless box shape. The inside 3 (the inner side) of the outer case 1 is formed as an internal space (a container) surrounded by a bottom wall 5 and a sidewall 4. In other words, the outer case 1 is formed in a box shape having one surface opposed to the bottom wall 5 as an opening surface. The sensor module 25 is housed to cover most of an opening section of the opening surface (to close the opening section). The sensor module 25 is exposed from the opening section (see FIG. 2). The opening surface opposed to the bottom wall 5 is flush with an upper surface 7 of the outer case 1. A planar shape of the inside 3 of the outer case 1 is a hexagon formed by chamfering corners of the two vertex portions of the square. The chamfered two vertex portions correspond to the positions of the screw holes 2. In a sectional shape (in the thickness direction) of the inside 3, a first joining surface 6 functioning as a bottom wall higher than the center by one stage is formed in the peripheral edge portion on the inside 3, that is, in the internal space. That is, the first joining surface 6 is a part of the bottom wall 5, is a step-like part of one stage formed in a ring shape to planarly surround the center of the bottom wall 5, and is a surface, the distance to which from the opening surface (flush with the upper surface 7) is smaller than the distance to the bottom wall 5.

The example is explained above in which the external shape of the outer case 1 is the rectangular parallelepiped, the planar shape of which is substantially square, and is the lidless box shape. However, the external shape of the outer case 1 is not limited to this. The planar shape of the external shape of the outer case 1 may be a polygon such as a hexagon or an octagon. Corners of vertex portions of the polygon may be chamfered or sides of the polygon may be curved lines. The planar shape of the inside 3 (the inner side) of the outer case 1 is not limited to the hexagon and may be a quadrate (a quadrangle) such as a square or another polygonal shape such as an octagon. The external shape of the outer case 1 and the planar shape of the inside 3 may be similar shapes or may not be similar shapes.

The inner case 20 is a member that supports the circuit board 15. The inner case 20 is formed in a shape fit in the inside 3 of the outer case 1. In detail, planarly, the inner case 20 is a hexagon obtained by chamfering corners of two vertex portions of a square. In the inner case 20, an opening section 21, which is a rectangular through-hole, is formed on a lower surface 27 of the hexagon in the plan view. A recessed section 28 provided on a surface on a side that supports the circuit board 15 is formed. The chamfered two vertex portions correspond to the positions of the screw holes 2 of the outer case 1. The thickness (in the Z-axis direction) of the inner case 20 is smaller than the height from the upper surface 7 of the outer case 1 to the first joining surface 6. In a preferred example, the inner case 20 is also formed by cutting aluminum. However, as in the outer case 1, another material may be used.

Guide pins for positioning the circuit board 15 and a supporting surface (both of which are not shown in FIG. 3) are formed on the rear surface (the surface on the outer case 1 side) of the inner case 20. The circuit board 15 is set (positioned and mounted) on the guide pins and the supporting surface and bonded to the rear surface of the inner case 20. Details of the circuit board 15 are explained below. The peripheral edge portion of the rear surface of the inner case 20 is formed as a second joining surface 22 formed by a ring-like plane. The second joining surface 22 planarly has a shape substantially the same as the first joining surface 6 of the outer case 1. When the inner case 20 is set in the outer case 1, the two surfaces are opposed to each other in a state in which the joining member 10 is held between the surfaces. The structures of the outer case 1 and the inner case 20 are examples and are not limited.

Configuration of the Circuit Unit

Figure 4:
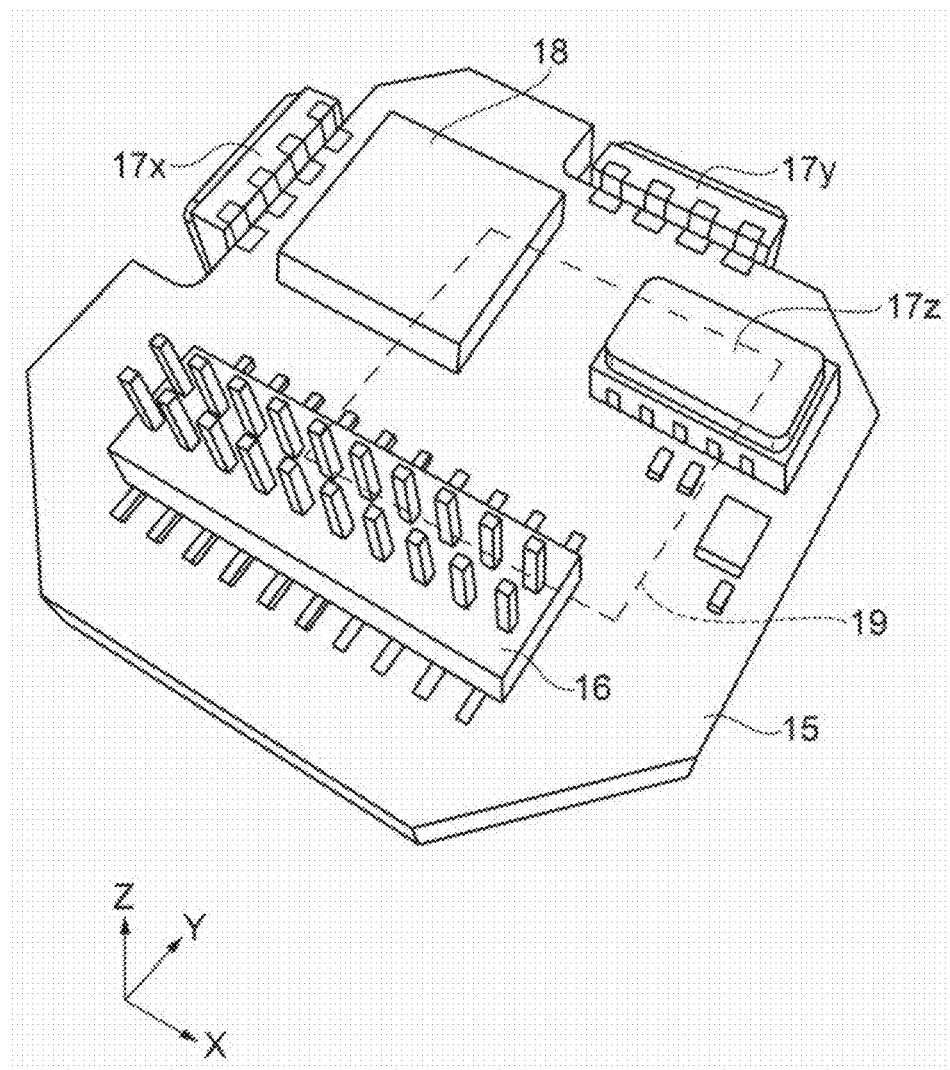
FIG. 4 is an exterior perspective view showing a schematic configuration of a circuit unit.

The configuration of the circuit unit in which the inertial sensor is mounted on the circuit board 15 is explained with reference to FIG. 4. FIG. 4 is an exterior perspective view showing a schematic configuration of the circuit unit.

The connector 16, an angular velocity sensor 17z, an acceleration sensor 18, and the like are mounted on a first surface (the surface 15f on the inner case 20 side, see FIG. 7A) of the circuit board 15 configuring the circuit unit. The connector 16 is a plug-type (male) connector. The connector 16 includes connection terminals in two rows disposed at equal pitches in the X-axis direction. The connection terminals suitably include ten pins in each row, that is, twenty pins in total. However, the number of terminals may be changed as desired according to a design specification.

The angular velocity sensor 17z is a gyro sensor that detects one-axis angular velocity in the Z-axis direction. As a suitable example, quartz is used as a vibrator. A vibration gyro sensor that detects angular velocity from a Coriolis force applied by a vibrating object is used as the angular velocity sensor 17z. The gyro sensor is not limited to the vibration gyro sensor and can be any sensor capable of detecting angular velocity. For example, a sensor in which ceramic or silicon is used as the vibrator may be used as the gyro sensor.

An angular velocity sensor 17x that detects one-axis angular velocity in the X-axis direction is mounted on the side surface in the X-axis direction of the circuit board 15 such that a mounting surface is orthogonal to the X axis. Similarly, an angular velocity sensor 17y that detects one-axis angular velocity in the Y-axis direction is mounted on the side surface in the Y-axis direction of the circuit board 15 such that a mounting surface is orthogonal to the Y axis. The circuit unit is not limited to the configuration including the three angular velocity sensors for the respective axes. The circuit unit may include a sensor capable of detecting three-axis angular velocities. For example, like the acceleration sensor 18 explained below, a sensor device capable of detecting three-axis angular velocities with one device (package) may be used.

As the acceleration sensor 18 functioning as an inertial sensor, a capacitance-type acceleration sensor, which is obtained by machining a silicon substrate with a MEMS technique, capable of detecting accelerations in three directions (three axes) of the X axis, the Y axis, and the Z axis with one device is used. The acceleration sensor 18 is not limited to this sensor and can be any sensor capable of detecting acceleration. For example, the acceleration sensor 18 may be a piezo-resistive acceleration sensor or a thermosensitive acceleration sensor. Like the angular velocity sensor, one acceleration sensor may be provided for each of the axes.

A control IC 19 is mounted on the rear surface (the surface on the outer case 1 side) of the circuit board 15. The control IC 19 is an MCU (Micro Controller Unit). The control IC 19 incorporates a storing section including a nonvolatile memory, an A/D converter, and the like and controls the sections of the sensor unit 100. The storing section has stored therein a computer program that specifies order and content for detecting acceleration and angular velocity, a computer program for digitizing detection data and incorporating the detection data in packet data, incidental data, and the like. Besides, a plurality of electronic components are mounted on the circuit board 15.

Configuration of X-axis and Y-axis acceleration sensors

Figure 5:
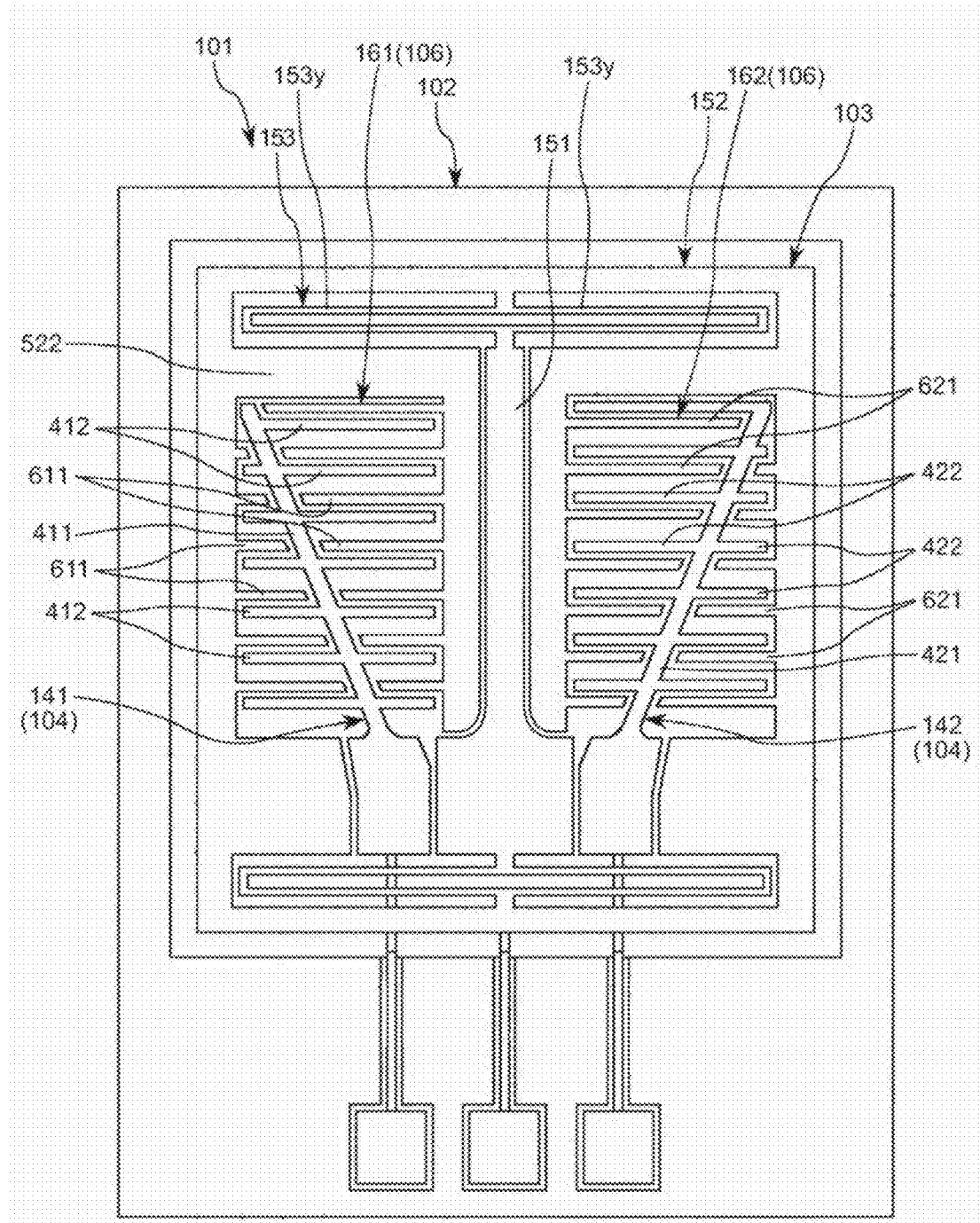
FIG. 5 is a plan view for explaining the configuration of X-axis and Y-axis acceleration sensors.

The configuration of an X-axis acceleration sensor and a Y-axis acceleration sensor mounted on the acceleration sensor 18 as inertial sensors is explained with reference to FIG. 5. FIG. 5 is a plan view for explaining the configuration of the X-axis acceleration sensor.

An X-axis acceleration sensor 101 shown in FIG. 5 detects acceleration Ax in the X-axis direction. Such an X-axis acceleration sensor 101 includes a base section 102 and an element section 103 provided in the base section 102 and configured to detect the acceleration Ax (a physical quantity) in the X-axis direction. The element section 103 includes a fixed electrode section 104 attached to the base section 102, a movable section 152 displaceable in the X-axis direction (a first direction, which is a detection axis direction of the physical quantity) with respect to the base section 102 via a spring section 153, and a movable electrode section 106 provided in the movable section 152. The fixed electrode section 104 includes a first fixed electrode section 141 and a second fixed electrode section 142 disposed side by side along the Y-axis direction (a second direction, which is a direction crossing (in this embodiment, orthogonal to) the detection axis). The first fixed electrode section 141 includes a first trunk section 411 and a plurality of first fixed electrode fingers 412 provided on both sides in the Y-axis direction (the second direction) of the first trunk section 411 and having a longitudinal direction along the second direction. The second fixed electrode section 142 includes a second trunk section 421 and a plurality of second fixed electrode fingers 422 provided on both sides in the Y-axis direction (the second direction) from the second trunk section 421 and having a longitudinal direction along the second direction. The movable electrode section 106 includes a first movable electrode section 161 and a second movable electrode section 162 disposed side by side along the Y-axis direction (the second direction). At least a part of the first movable electrode section 161 includes a plurality of first movable electrode fingers 611 located on both sides in the Y-axis direction (the second direction) of the first trunk section 411, having a longitudinal direction along the second direction, and opposed to the first fixed electrode fingers 412 in the X-axis direction (the first direction). At least a part of the second movable electrode section 162 includes a plurality of second movable electrode fingers 621 located on both sides in the Y-axis direction (the second direction) of the second trunk section 421, having a longitudinal direction along the second direction, and opposed to the second fixed electrode fingers 422 in the X-axis direction (the first direction). By adopting such a configuration, it is possible to respectively reduce the first fixed electrode fingers 412, the second fixed electrode fingers 422, the first movable electrode fingers 611, and the second movable electrode fingers 621 in length while keeping capacitance between the first movable electrode fingers 611 and the first fixed electrode fingers 412 and capacitance between the second movable electrode fingers 621 and the second fixed electrode fingers 422 sufficiently large. Therefore, the first fixed electrode fingers 412, the second fixed electrode fingers 422, the first movable electrode fingers 611, and the second movable electrode fingers 621 are hardly broken. The X-axis acceleration sensor 101 having excellent shock resistance is obtained.

Although not shown in FIG. 5, by disposing the X-axis acceleration sensor 101 shown in FIG. 5 and explained in the direction in which the base section 102 and the element section 103 provided in the base section 102 are disposed side by side along the Y-axis direction, the X-direction acceleration sensor 101 can function as a Y-axis acceleration sensor and detect acceleration in the Y-axis direction.

Acceleration Sensor Element that Detects Acceleration in the Z-Axis Direction

Figure 6:
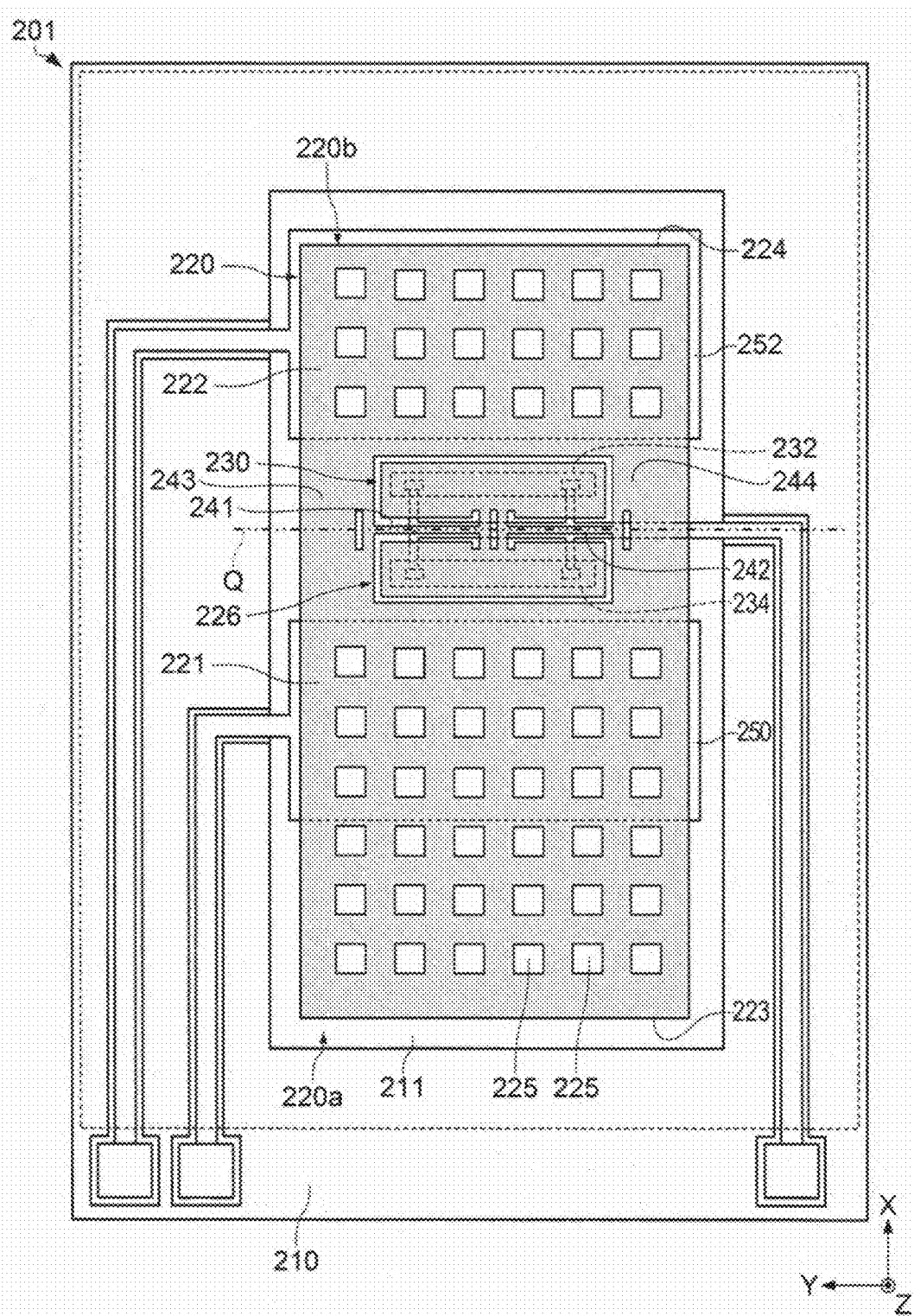
FIG. 6 is a plan view for explaining the configuration of a Z-axis acceleration sensor.

FIG. 6 is a plan view for explaining the configuration of a Z-axis acceleration sensor. The configuration of the Z-axis acceleration sensor mounted on the acceleration sensor 18 functioning as the inertial sensor is explained with reference to FIG. 6.

A Z-axis acceleration sensor 201 includes a movable body 220. Further, the movable body 220 includes a first movable section 220a and a second movable section 220b. The movable body 220 includes, in the plan view, with a support axis Q as a boundary, a first movable section 220a on one side in a direction orthogonal to the support axis Q and a second movable section 220b on the other side in the orthogonal direction. The movable body 220 further includes a third beam section 243 and a fourth beam section 244 configured to connect the first movable section 220a and the second movable section 220b, a first beam section 241 configured to couple first and second fixed sections 232 and 234 and the third beam section 243, a second beam section 242 configured to couple the first and second fixed sections 232 and 234 and the fourth beam section 244, and an opening section 226 disposed between the third beam section 243 and the fourth beam section 244 in the plan view. The first movable section 220a is located on one side of the support axis Q (in an example shown in FIG. 6, a −X-axis direction) in the plan view (when viewed from the Z-axis direction side). The second movable section 220b is located on the other side of the support axis Q (in the example shown in FIG. 6, on a +X-axis direction side).

When acceleration (e.g., gravitational acceleration) in the vertical direction is applied to the movable body 220, rotational moments (moments of force) are respectively generated in the first movable section 220a and the second movable section 220b. When the rotational moment (e.g., a counterclockwise rotational moment) of the first movable section 220a and the rotational moment (e.g., a clockwise rotational moment) of the second movable section 220b are balanced, a change does not occur in a tilt of the movable body 220 and acceleration cannot be detected. Therefore, the movable body 220 is designed such that the rotational moment of the first movable section 220a and the rotational moment of the second movable section 220b are not balanced and a predetermined tilt occurs in the movable body 220 when the acceleration in the vertical direction is applied.

In the Z-axis acceleration sensor 201, the support axis Q is disposed in a position deviating from the center (the center of gravity) of the movable body 220 (distances from the support axis Q to the distal ends of the first movable section 220a and the second movable section 220b are set different from each other), whereby the mass of the first movable section 220a and the mass of the second movable section 220b are different from each other. That is, in the movable body 220, the mass on one side (the first movable section 220a) and the mass on the other side (the second movable section 220b) are different with the support axis Q as a boundary. In the example shown in FIG. 6, the distance from the support axis Q to an end face 223 of the first movable section 220a is larger than the distance from the support axis Q to an end face 224 of the second movable section 220b. The thickness of the first movable section 220a and the thickness of the second movable section 220b are equal. Therefore, the mass of the first movable section 220a is larger than the mass of the second movable section 220b.

In this way, the mass of the first movable section 220a and the mass of the second movable section 220b are different from each other. Consequently, when the acceleration in the vertical direction is applied, it is possible to prevent the rotational moment of the first movable section 220a and the rotational moment of the second movable section 220b from being balanced. Therefore, when the acceleration in the vertical direction is applied, it is possible to cause the predetermined tilt in the movable body 220.

Although not shown in FIG. 6, the mass of the first movable section 220a and the mass of the second movable section 220b may be set different from each other by disposing the support axis Q in the center of the movable body 220 and setting the thickness of the first movable section 220a and the thickness of the second movable section 220b different from each other. Even in such a case, when the acceleration in the vertical direction is applied, it is possible to cause the predetermined tilt in the movable body 220.

The movable body 220 is provided to be separated from a substrate 210. The movable body 220 is provided above a recessed section 211. A gap is provided between the movable body 220 and the substrate 210. Consequently, the movable body 220 can swing.

The movable body 220 includes a first movable electrode 221 and a second movable electrode 222 provided with the support axis Q as a boundary. The first movable electrode 221 is provided in the first movable section 220a. The second movable electrode 222 is provided in the second movable section 220b.

The first movable electrode 221 is a portion overlapping the first fixed electrode 250 in the plan view in the movable body 220. The first movable electrode 221 forms capacitance C1 between the first movable electrode 221 and the first fixed electrode 250. That is, the capacitance C1 is formed by the first movable electrode 221 and the first fixed electrode 250.

The second movable electrode 222 is a portion overlapping the second fixe electrode 252 in the plan view in the movable body 220. The second movable electrode 222 forms capacitance C2 between the second movable electrode 222 and the second fixed electrode 252. That is, the capacitance C2 is formed by the second movable electrode 222 and the second fixed electrode 252. In the Z-axis acceleration sensor 201, the movable body 220 is made of a conductive material (silicon doped with impurities), whereby the first movable electrode 221 and the second movable electrode 222 are provided. That is, the first movable section 220a functions as the first movable electrode 221. The second movable section 220b functions as the second movable electrode 222.

The capacitance C1 and the capacitance C2 are set to be equal to each other, for example, in a state in which the movable body 220 is horizontal. The positions of the first movable electrode 221 and the second movable electrode 222 change according to a movement of the movable body 220. The capacitance C1 and the capacitance C2 change according to the positions of the first movable electrode 221 and the second movable electrode 222. Predetermined potential is applied to the movable body 220 via a supporting section 230.

A plurality of through-holes 225 piecing through the movable body 220 are formed in the movable body 220. Consequently, the influence of the air (the resistance of the air) at the time when the movable body 220 swings can be reduced. In the example shown in FIG. 6, a planar shape of each through-hole 225 is a square.

The opening section 226 piercing through the movable body 220 is provided in the movable body 220. The opening section 226 is provided on the support axis Q in the plan view. In the example shown in FIG. 6, a planar shape of the opening section 226 is a rectangle.

The supporting section 230 is provided on the substrate 210. The supporting section 230 is located in the opening section 226. The supporting section 230 supports the movable body 220. The supporting section 230 includes the first fixed section 232, the second fixed section 234, the first beam section 241, the second beam section 242, the third beam section 243, and the fourth beam section 244.

The first fixed section 232 and the second fixed section 234 are fixed to the substrate 210. The first fixed section 232 and the second fixed section 234 are provided across the support axis Q in the plan view. In the example shown in FIG. 6, the first fixed section 232 is provided on the +X-axis direction side of the support axis Q and the second fixed section 234 is provided on the −X-axis direction side of the support axis Q.

Configuration of the Circuit Board

Figure 7A:
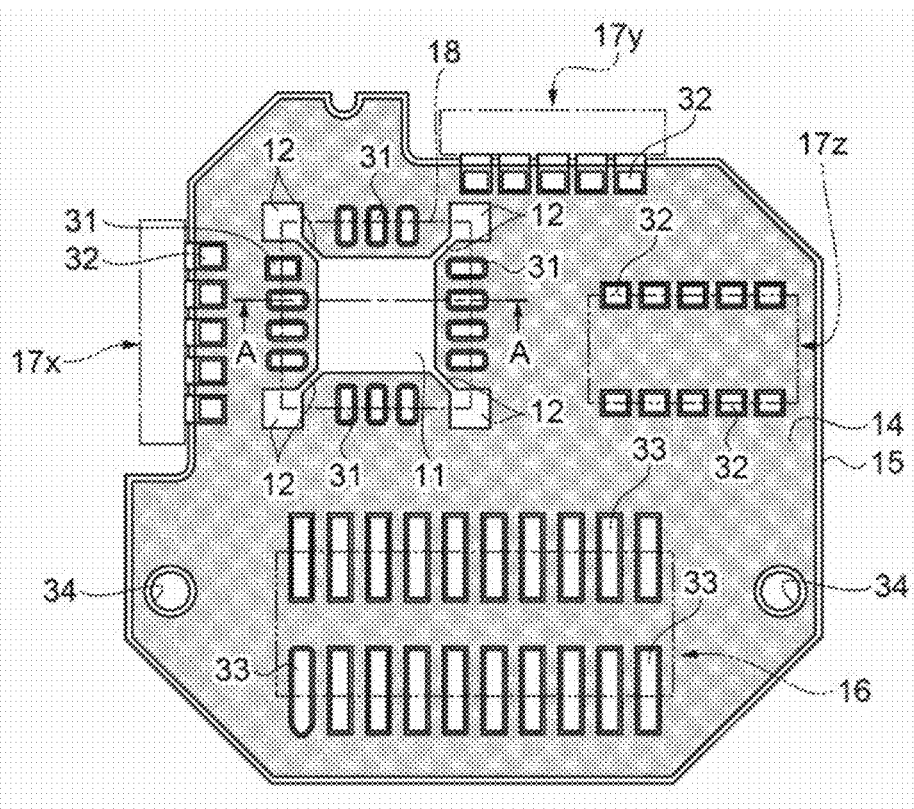
FIG. 7A is a plan view showing a disposition pattern of an insulating layer of a circuit board.
Figure 7B:
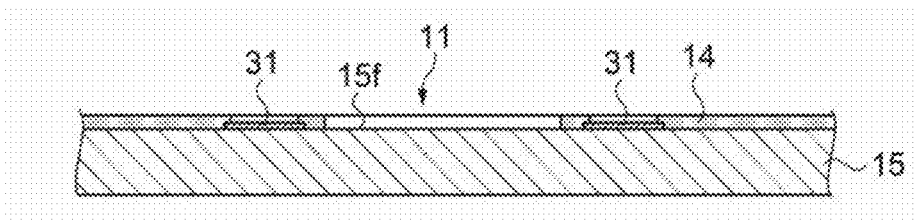
FIG. 7B is a sectional view of FIG. 7A taken along line A-A.
Figure 7C:
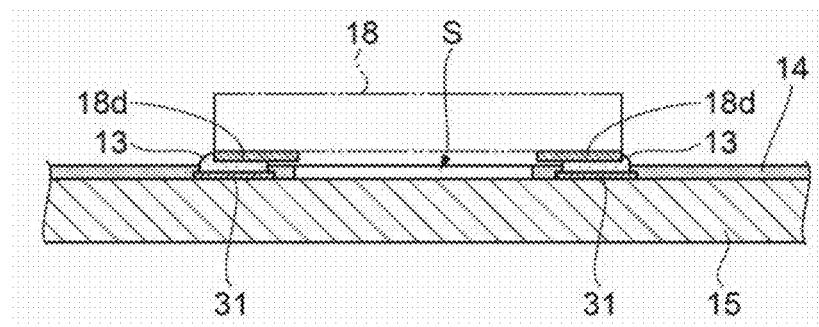
FIG. 7C is a sectional view showing a mounted state of an acceleration sensor on the circuit board.

The configuration of the circuit board 15 configuring the circuit unit is explained with reference to FIGS. 7A, 7B, and 7C. FIG. 7A is a plan view showing a disposition pattern of an insulating layer of the circuit board. FIG. 7B is a sectional view taken along an A-A line in FIG. 7A. FIG. 7C is a sectional view showing a mounted state of the acceleration sensor on the circuit board.

The circuit board 15 is a multilayer substrate in which a plurality of through-holes are formed. A glass epoxy substrate is used as the circuit board 15. The circuit board 15 is not limited to the glass epoxy substrate and can be any rigid substrate on which pluralities of inertial sensors, electronic components, connectors, and the like can be mounted. For example, a composite substrate or a ceramic substrate may be used as the circuit board 15.

On the first surface 15$f$ of the circuit board 15, a plurality of electrode pads 31, 32, and 33, to which a plurality of mounting terminals of the acceleration sensor functioning as the inertial sensor, the connector 16, the angular velocity sensors 17$x$, 17$y$, and 17$z$, and the like are respectively attached via connecting members 13 such as solder or a conductive adhesive, and a through-hole 34 are provided. An insulating layer 14 formed by, for example, resist resin is provided on the outer side of the plurality of electrode pads 31, 32, and 33. In other words, the respective electrode pads 31, 32, and 33 are formed in openings of the insulating layer 14. The first surface 15$f$ of the circuit board 15 includes a first region 11 (a first well) and second regions 12 (second wells and grooves), which are regions where the insulating layer 14 is not provided (a relief pattern).

The acceleration sensor 18 in this embodiment is formed in a square shape in a plan view from a direction right opposed to the first surface 15$f$ of the circuit board 15. The plurality of mounting terminals are disposed on an opposed pair of sides of the square shape. That is, the plurality of electrode pads 31 are disposed on the first surface 15$f$ of the circuit board 15 corresponding to the mounting terminals. The acceleration sensor 18 is a sensor component of a surface mounting type (SMD: Surface Mount Device). In this embodiment, the acceleration sensor 18 is surface-mounted (SMT: Surface mount technology) on the plurality of electrode pads 31, which are disposed on the first surface 15$f$ of the circuit board 15, by soldering (the connecting members 13).

The first region 11 is present in a center region further on the inner side than (inboard of) the electrode pads 31 on which the acceleration sensor 18 is mounted. The first region 11 is provided in a position overlapping (aligned with) the center of the acceleration sensor 18. The second regions 12 are regions extending from the first region 11 to the outer side of the outer peripheral edge of the acceleration sensor 18. That is, as shown in FIG. 7C, a gap S equivalent to the thickness of the insulating layer 14 is provided between the acceleration sensor 18, to which mounting terminals 18$d$ of the acceleration sensor 18 and the electrode pads 31 are connected by the connecting members 13 such as solder, and the first surface 15$f$ of the circuit board 15. The gap S continues from a position overlapping the center of the acceleration sensor 18 to the outer side of the outer peripheral edge of the acceleration sensor 18.

That is, in the sensor unit 100, by not providing the insulating layer 14 between the center region of the acceleration sensor 18 and the circuit board 15, it is possible to set an interval (the gap S) between the acceleration sensor 18 and the circuit board 15 to be larger than when the insulating layer 14 is provided. Consequently, cleaning liquid for removing foreign matters present between the acceleration sensor 18 and the circuit board 15 easily enters between the acceleration sensor 18 and the circuit board 15. Thus, a cleaning effect for the foreign matters can be improved. That is, since the foreign matters less easily remain in the interval (the gap S) between the acceleration sensor 18 and the circuit board 15, stress generated in the acceleration sensor 18 by a change in a state of the foreign matters such as thermal expansion or thermal contraction of the remaining foreign matters by a temperature change is reduced. Therefore, it is possible to reduce deterioration in detection accuracy of the acceleration sensor 18 related to a temperature change such as temperature hysteresis of a bias signal.

Figure 8:
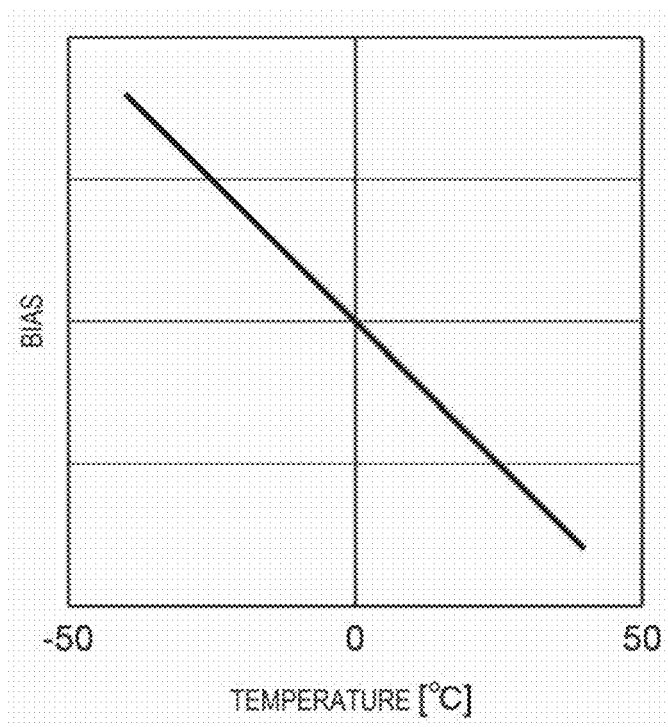
FIG. 8 is a graph showing a temperature characteristic of an acceleration output of the sensor unit including the circuit board in the embodiment.
Figure 9A:
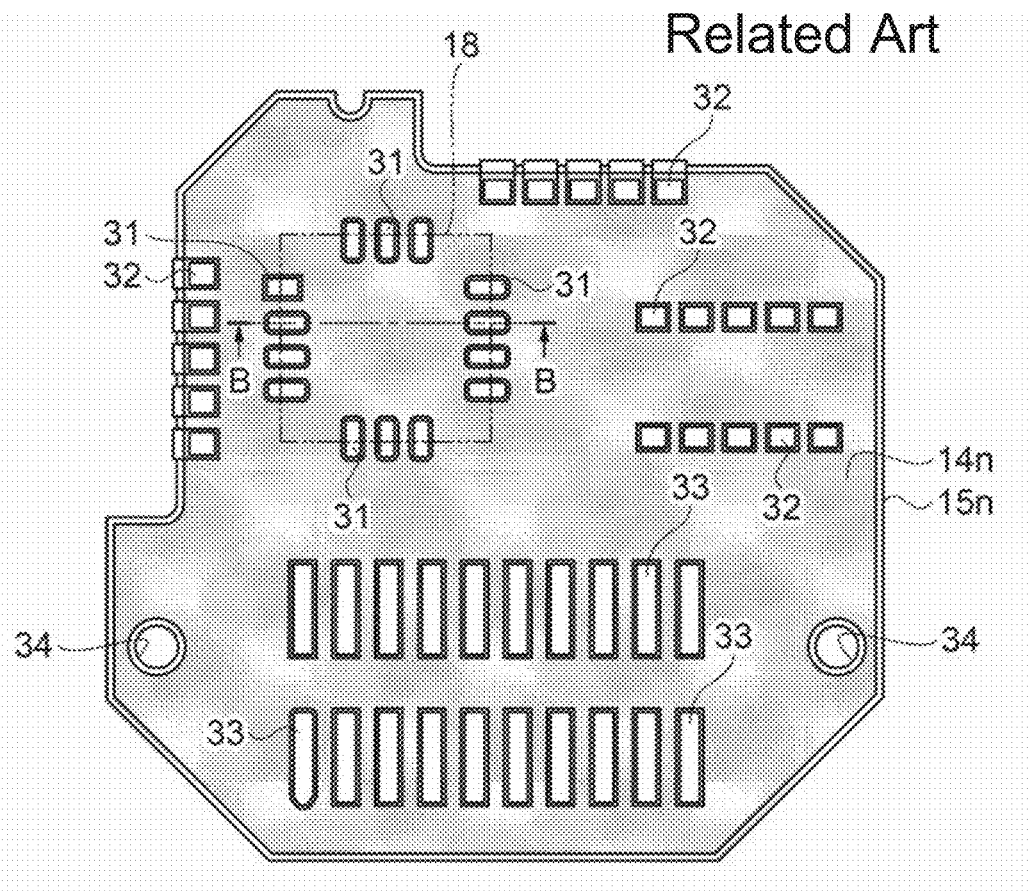
FIG. 9A is a plan view showing a disposition pattern of an insulating layer of a circuit board in a comparative example.
Figure 9B:
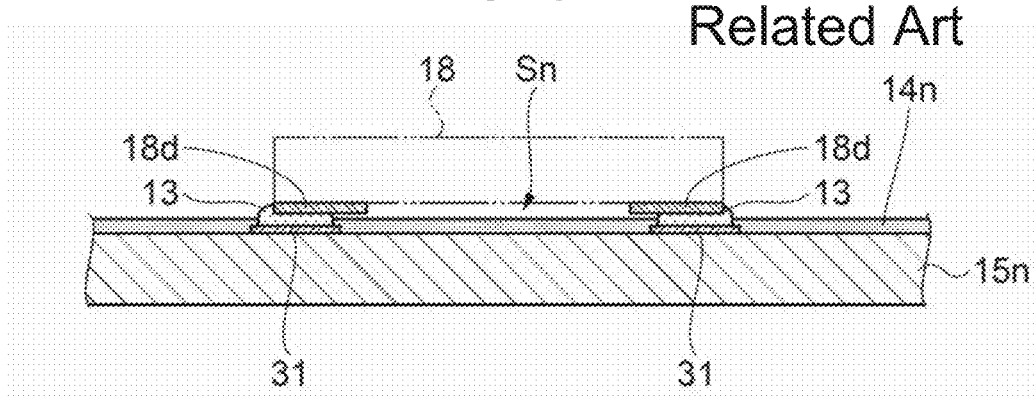
FIG. 9B is a sectional view of FIG. 9A taken along line B-B.
Figure 10:
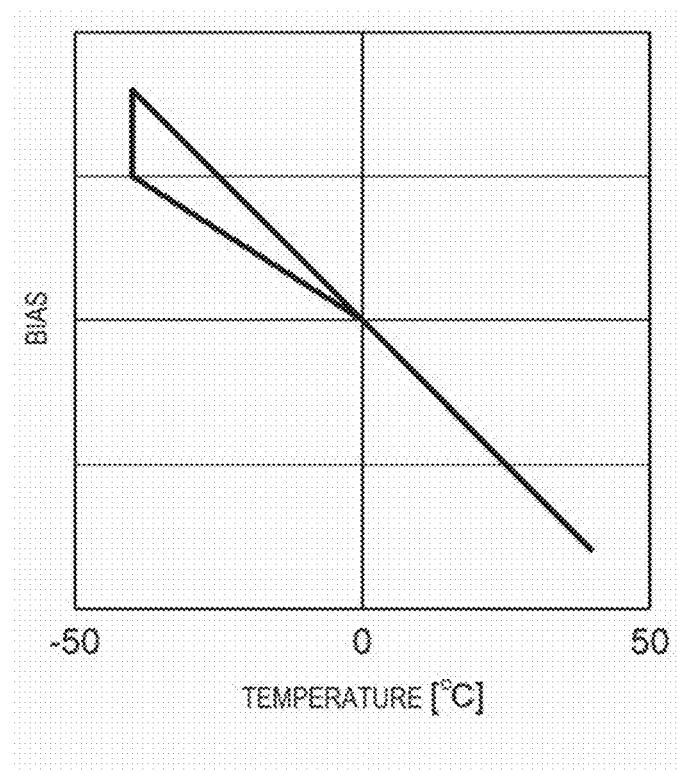
FIG. 10 is a graph showing a temperature characteristic of an acceleration output of a sensor unit including the circuit board in the comparative example.

Specifically, an effect of reducing deterioration in detection accuracy at the time when a temperature change is given to the acceleration sensor 18 of the sensor unit 100 including the circuit board 15 having such a configuration is shown in FIG. 8 and explained. As a comparative example, the configuration of a circuit board on which the first region 11 and the second regions 12 are not provided is shown in FIGS. 9A and 9B. An output characteristic at the time when a temperature change is given to an acceleration sensor of a sensor unit including the circuit board is shown in FIG. 10. FIG. 8 is a graph showing a temperature characteristic of an acceleration output of the sensor unit including the circuit board having the configuration according to the invention. FIG. 9A is a plan view showing a disposition pattern of an insulating layer of the circuit board in the comparative example. FIG. 9B is a B-B sectional view of FIG. 9A. FIG. 10 is a graph showing a temperature characteristic of an acceleration output of the sensor unit including the circuit board in the comparative example.

First, a circuit board 15$n$ in the comparative example has a configuration in which the first region 11 and the second regions 12 in the configuration explained above are not provided. That is, when the acceleration sensor 18 is connected to the circuit board 15$n$ by surface mounting, the acceleration sensor 18 is connected to the circuit board 15$n$ by, for example, soldering in a state in which a gap Sn between a bottom surface on the circuit board 15$n$ side of the acceleration sensor 18 and an insulating layer 14$n$ is small. When the gap Sn is small in this way, cleaning liquid for removing foreign matters present between the acceleration sensor 18 and the circuit board 15$n$ less easily enters between the acceleration sensor 18 and the circuit board 15$n$ and a cleaning effect for the foreign matters is deteriorated. Therefore, the foreign matters sometimes remain without being fully removed. When remaining foreign matters are present below the acceleration sensor 18 and a temperature change occurs in the remaining foreign matters, a state of the remaining foreign matters changes. In detail, the remaining foreign matters expand when temperature rises and contract when temperature falls. The acceleration sensor 18 sometimes detects a stress change due to a volume change of the remaining foreign matters. As a result, when the temperature is changed from a high-temperature side to a low-temperature side, a bias shift (temperature hysteresis of a bias signal (a detection output signal)) phenomenon of detected acceleration in a low-temperature region shown in FIG. 10 occurs. In order to remove the foreign matters remaining in such as small gap Sn, it is necessary to increase the number of times of cleaning to repeat the cleaning or extend a cleaning time. As a result, a manufacturing manhour of the sensor unit increases.

On the other hand, in the circuit board 15 in this embodiment shown in FIG. 7A and explained above, even if the acceleration sensor 18 is connected to the circuit board 15 by surface mounting, since the insulating layer 14 is not provided between the center region of the acceleration sensor 18 and the circuit board 15, it is possible to set the interval (the gap S) between the acceleration sensor 18 and the circuit board 15 to be larger than when the insulating layer 14 is provided. It is possible to improve a cleaning effect for the remaining foreign matters and easily remove the remaining foreign matters by performing cleaning once or in a short time. Therefore, with the circuit board 15 in this embodiment shown in FIG. 7A and explained above, it is possible to obtain an output characteristic (a bias) in which the bias shift phenomenon of the detected acceleration in the low-temperature region seen in the comparative example in which the remaining foreign matters are present is not seen as shown in FIG. 8.

Modifications of the First Region and the Second Region

In the circuit board 15, the first region and the second region where the insulating layer 14 is not provided can be provided in various forms. Modifications of the first region and the second region are explained below in order.

Modification 1

Figure 11A:
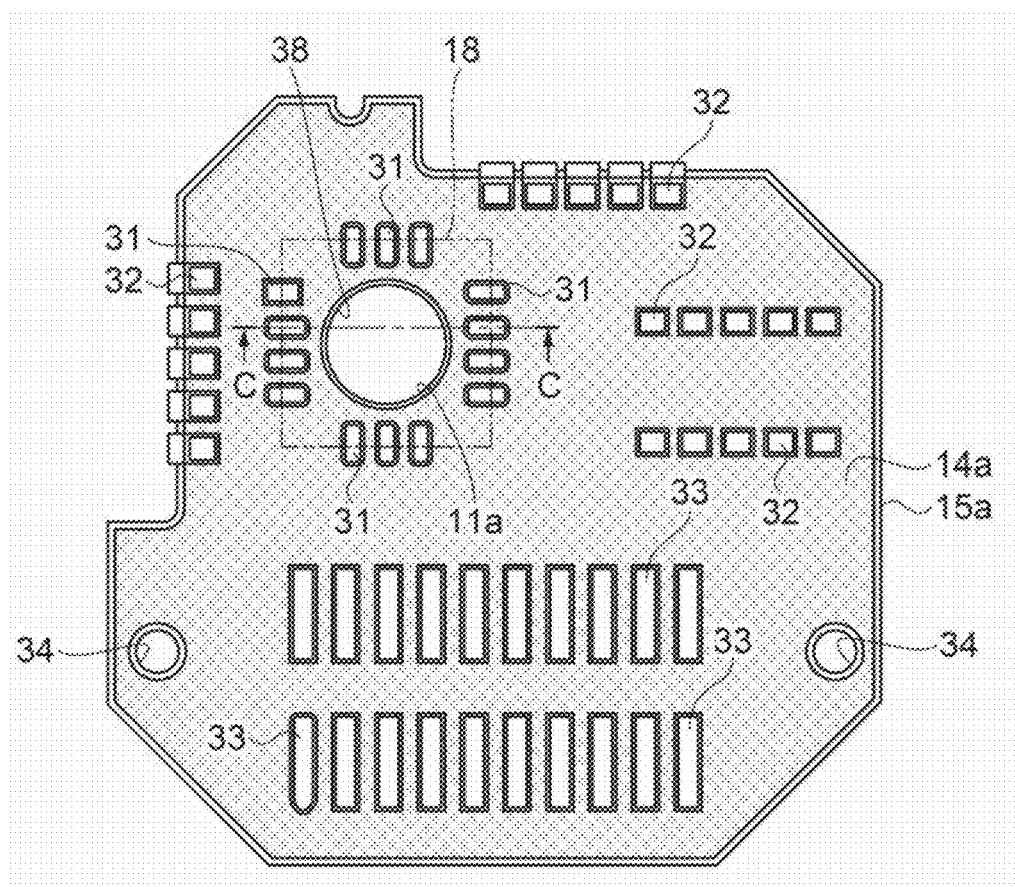
FIG. 11A is a plan view showing a disposition pattern of an insulating layer of a circuit board according to modification 1.
Figure 11B:
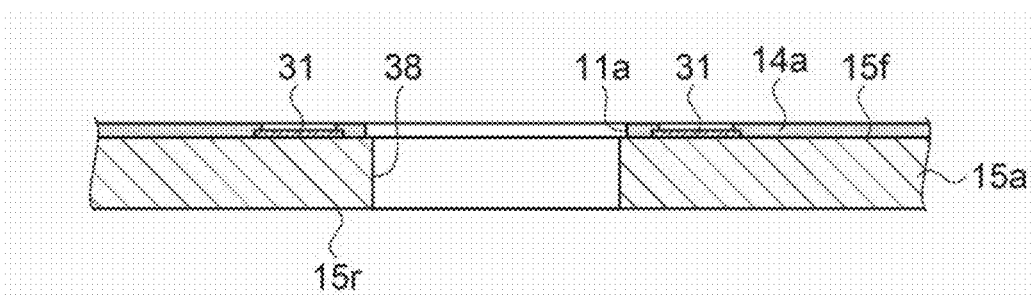
FIG. 11B is a sectional view of FIG. 11A taken along line C-C.

First, a modification 1 of the first region and the second region is explained with reference to FIGS. 11A and 11B. FIG. 11A is a plan view showing a disposition pattern of an insulating layer of a circuit board according to the modification 1. FIG. 11B is a C-C sectional view of FIG. 11A.

As shown in FIGS. 11A and 11B, a disposition pattern of an insulating layer 14a of a circuit board 15a according to the modification 1 includes a first region 11a formed by a through-hole 38 present in a center region further on the inner side than the electrode pads 31, on which the acceleration sensor 18 (see FIG. 4) is mounted, and provided in a position overlapping the center of the acceleration sensor 18. That is, the first region 11a is a region where the insulating layer 14a is not disposed because of the through-hole 38. The through-hole 38 pierces through from the first surface 15f to a second surface 15r having a front-rear relation with the first surface 15f. The through-hole 38 may not be circular and may be formed in any shape.

Since such a first region 11a (the through-hole 38) is provided, a large space can be provided on the bottom surface side of the acceleration sensor 18. Consequently, it is possible to reduce the remaining of the foreign matters. Further, it is possible to further reduce the occurrence of the remaining foreign matters because the cleaning liquid sufficiently spreads.

Modification 2

Figure 12A:
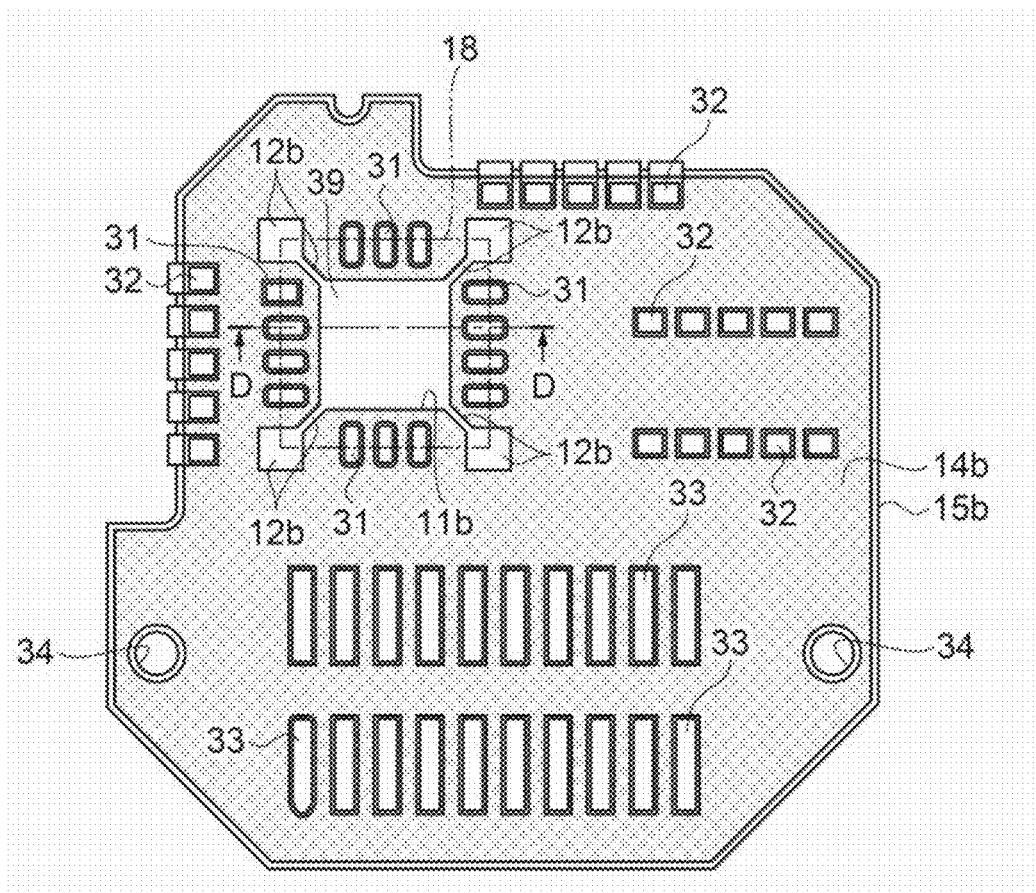
FIG. 12A is a plan view showing a disposition pattern of an insulating layer of a circuit board according to modification 2.
Figure 12B:
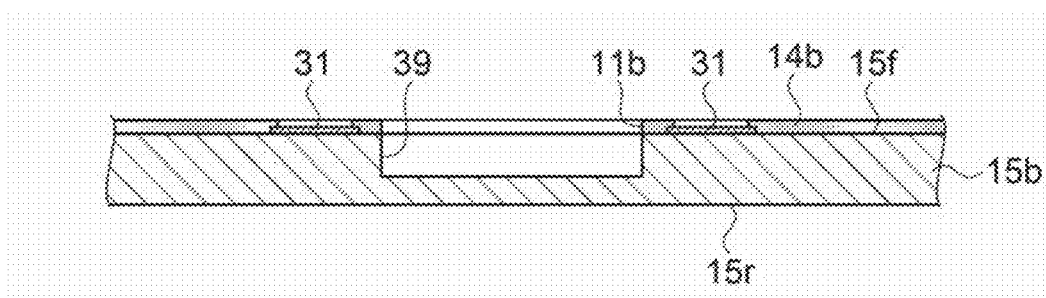
FIG. 12B is a sectional view of FIG. 12A taken along line D-D.

A modification 2 of the first region and the second region is explained with reference to FIGS. 12A and 12B. FIG. 12A is a plan view showing a disposition pattern of an insulating layer of a circuit board according to modification 2. FIG. 12B is a D-D sectional view of FIG. 12A.

As shown in FIGS. 12A and 12B, a disposition pattern of an insulating layer 14b of a circuit board 15b according to the modification 2 includes a first region 11b present in a center region further on the inner side than the electrode pads 31, on which the acceleration sensor 18 (see FIG. 4) is mounted, and provided in a position overlapping the center of the acceleration sensor 18. Further, the disposition pattern of the insulating layer 14b of the circuit board 15b according to the modification 2 includes second regions 12b, which are regions extending from the first region 11b to the outer side of the outer peripheral edge of the acceleration sensor 18 in positions at four corners of the outer peripheral edge of the acceleration sensor 18. The first region 11b and the second regions 12b are regions where the insulating layer 14b is not disposed. In the modification 2, a recessed section 39 recessed from the first surface 15f in the direction of the second surface 15r is provided in positions overlapping the first region 11b and the second regions 12b.

Since the recessed section 39 is provided in the first region 11b and the second regions 12b in this way, a large space can be provided between the acceleration sensor 18 and the circuit board 15b. Consequently, it is possible to reduce the remaining of the foreign matters. It is possible to further reduce the occurrence of the remaining foreign matters because the cleaning liquid sufficiently spreads.

Modification 3

Figure 13A:
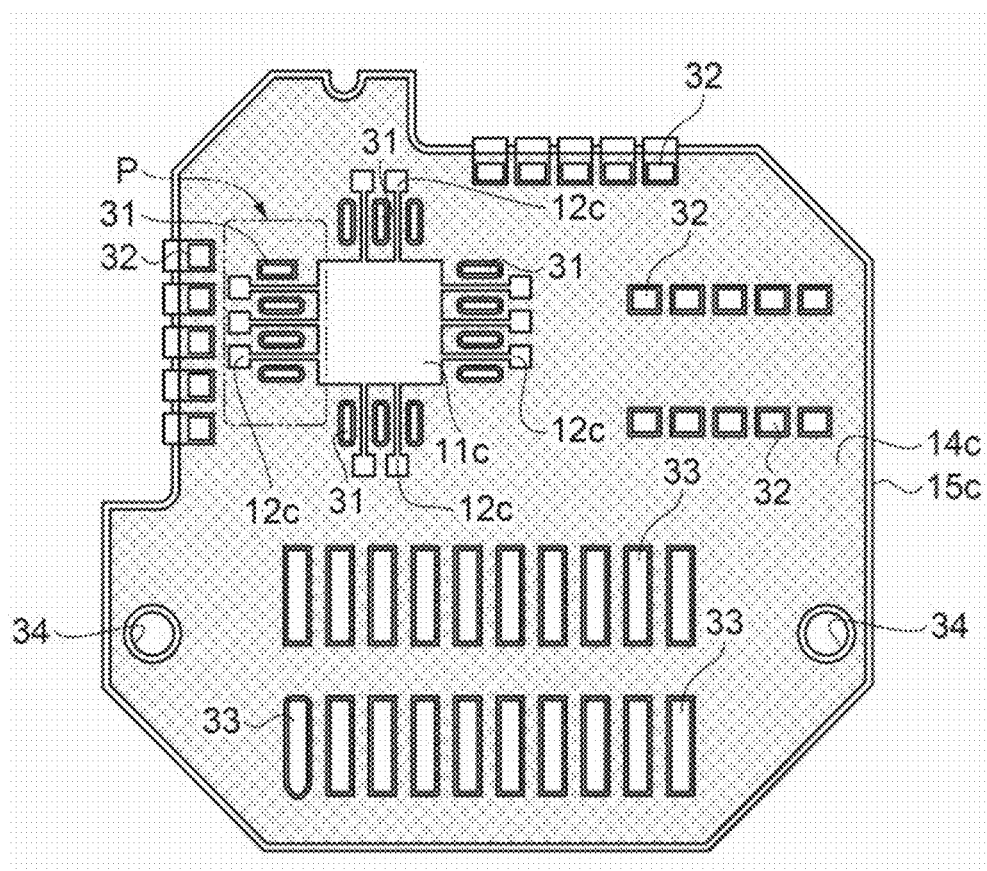
FIG. 13A is a plan view showing a disposition pattern of an insulating layer of a circuit board according to modification 3.
Figure 13B:
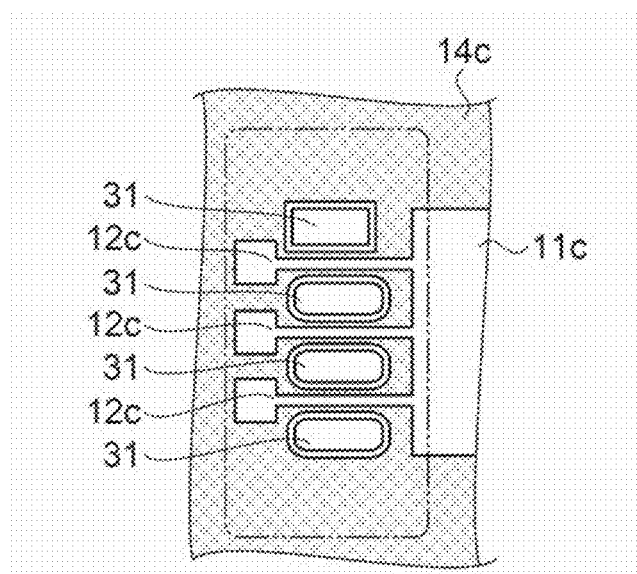
FIG. 13B is an enlarged view of the area P shown in FIG. 13A.

A modification 3 of the first region and the second region is explained with reference to FIGS. 13A and 13B. FIG. 13A is a plan view showing a disposition pattern of an insulating layer of a circuit board according to the modification 3. FIG. 13B is a P part enlarged view of FIG. 13A.

As shown in FIGS. 13A and 13B, a disposition pattern of an insulating layer 14c of a circuit board 15c according to the modification 3 includes a first region 11c present in a center region further on the inner side than the electrode pads 31, on which the acceleration sensor 18 (see FIG. 4) is mounted, and provided in a position overlapping the center of the acceleration sensor 18. Further, the disposition pattern of the insulating layer 14c of the circuit board 15c according to the modification 3 includes second regions 12c, which are regions extending from the first region 11c to the outer side of the outer peripheral edge of the acceleration sensor 18. The first region 11c and the second regions 12c are regions where the insulating layer 14c is not disposed. The second regions 12c in the modification 3 are disposed among the electrode pads 31 adjacent to one another and extending from the first region 11c to the outer side of the outer peripheral edge of the acceleration sensor 18.

Since the second regions 12c are provided among the electrode pads 31 adjacent to one another in this way, the area of the second regions 12c coupled to the first region 11c increases. It is possible to further reduce the occurrence of the remaining foreign matters because the cleaning liquid sufficiently spreads.

Modification 4

Figure 14A:
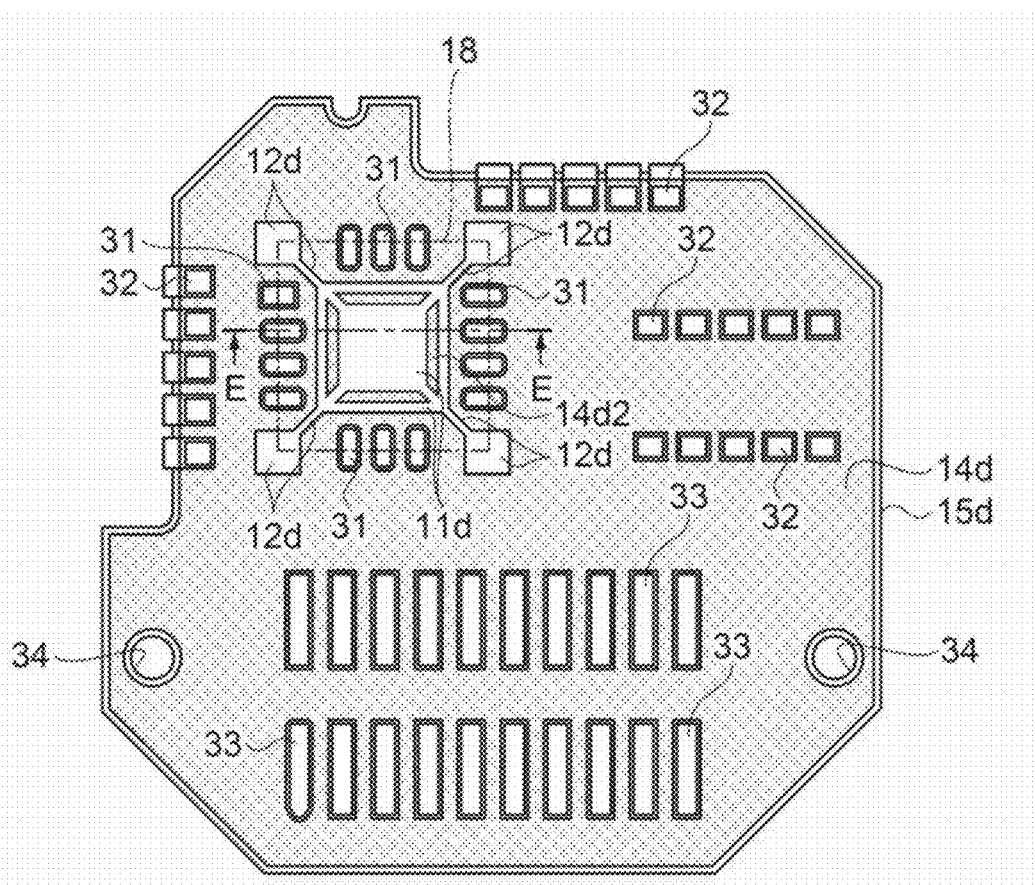
FIG. 14A is a plan view showing a disposition pattern of an insulating layer of a circuit board according to modification 4.
Figure 14B:
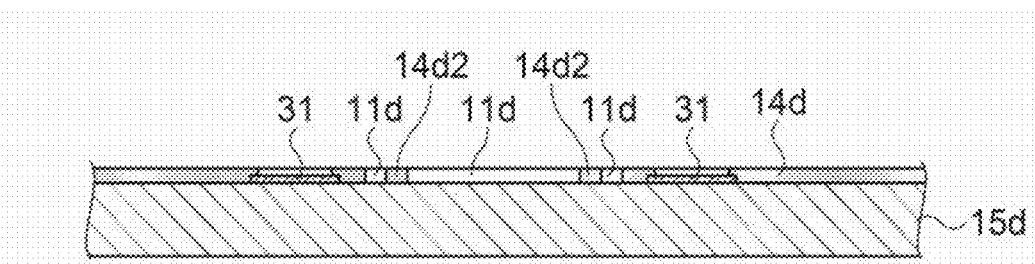
FIG. 14B is a sectional view of FIG. 14A taken along line E-E.

A modification 4 of the first region and the second region is explained with reference to FIGS. 14A and 14B. FIG. 14A is a plan view showing a disposition pattern of an insulating layer of a circuit board according to the modification 4. FIG. 14B is an E-E sectional view of FIG. 13A.

As shown in FIGS. 14A and 14B, a disposition pattern of an insulating layer 14d of a circuit board 15d according to the modification 4 includes a first region 11d present in a center region further on the inner side than the electrode pads 31, on which the acceleration sensor 18 (see FIG. 4) is mounted, and provided in a position overlapping the center of the acceleration sensor 18. In the first region 11d, projecting sections 14d2 having a peripheral shape and not connected at four corners are provided between the center of the acceleration sensor 18 and the electrode pads 31 in the plan view.

The projecting sections 14d2 are disposed closer to the electrode pads 31 side than the center side of the acceleration sensor 18. Since the projecting sections 14d2 are disposed closer to the electrode pads 31 side than the center side of the acceleration sensor 18 in this way, the foreign matters less easily reach the center of the acceleration sensor 18 where the foreign matters tend to remain.

The projecting sections 14d2 are desirably formed by the insulating layer 14d. By forming the projecting sections 14d2 from the insulating layer 14d in this way, it is possible to easily form the projecting sections 14d2 in the same process as a process for forming the insulating layer 14d.

The disposition pattern of the insulating layer 14d of the circuit board 15d according to the modification 4 includes second regions 12d, which are regions extending from the first region 11d to the outer side of the outer peripheral edge of the acceleration sensor 18 in the positions at the four corners of the outer peripheral edge of the acceleration sensor 18. The first region 11d and the second regions 12d are regions where the insulating layer 14d is not disposed.

In the disposition pattern of the insulating layer 14d according to the modification 4 explained above, the projecting sections 14d2 are provided between the center of the acceleration sensor 18 and the electrode pads 31. Consequently, it is possible to block, with the projecting sections 14d2, the foreign matters intruding toward the center of the acceleration sensor 18 where the foreign matters tend to remain.

The projecting sections 14d2 may have a peripheral form or a peripheral and unconnected form.

Modification 5

A modification 5 of the first region and the second region is explained with reference to FIG. 15.

Figure 15:
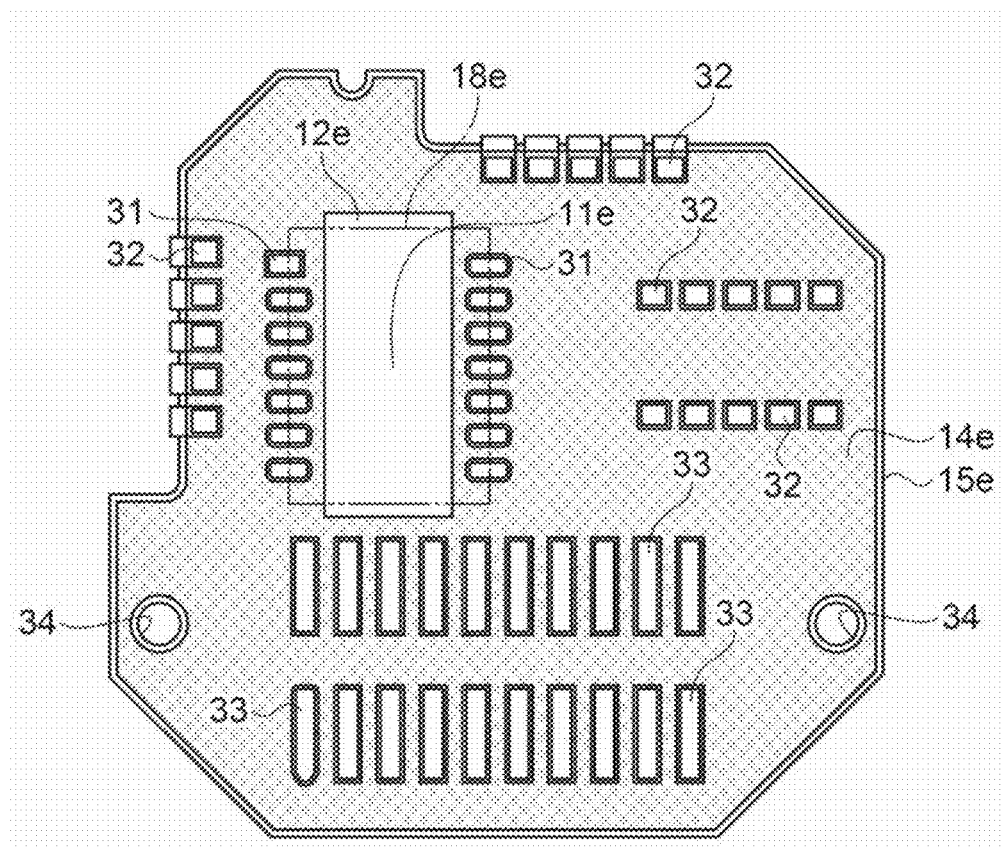
FIG. 15 is a plan view showing a disposition pattern of an insulating layer of a circuit board according to modification 5.

FIG. 15 is a plan view showing a disposition pattern of an insulating layer of a circuit board according to the modification 5.

As shown in FIG. 15, a disposition pattern of an insulating layer 14e of a circuit board 15e according to the modification 5 includes a first region 11e present in a center region further on the inner side than the electrode pads 31, on which an acceleration sensor 18e is mounted, and provided in a position overlapping the center of the acceleration sensor 18e and second regions 12e, which are regions extending from the first region 11e to the outer side of the outer peripheral edge of the acceleration sensor 18e. The first region 11e and the second regions 12e are regions where the insulating layer 14b is not disposed.

The acceleration sensor 18e used in this modification has a square shape in the plan view. A plurality of mounting terminals are disposed on an opposed pair of sides of the square shape. That is, the plurality of electrode pads 31 are disposed in parallel along the opposed pair of sides. The first region 11e and the second regions 12e are respectively provided to traverse the pair of sides of the acceleration sensor 18e located in directions in which the electrode pads 31 are not arrayed.

In the disposition pattern of the insulating layer 14e according to the modification 5 explained above, the second regions 12e can be provided to extend in directions in which the mounting terminals of the acceleration sensor 18e are not disposed. Consequently, since the second regions 12e having large width can be formed, it is possible to cause the cleaning liquid for foreign matters remaining in a gap between the acceleration sensor 18e and the circuit board 15e to easily flow in. Therefore, it is possible to easily discharge the foreign matters remaining in the gap between the acceleration sensor 18e and the circuit board 15e by performing cleaning.

Sixth Modification

Figure 16A:
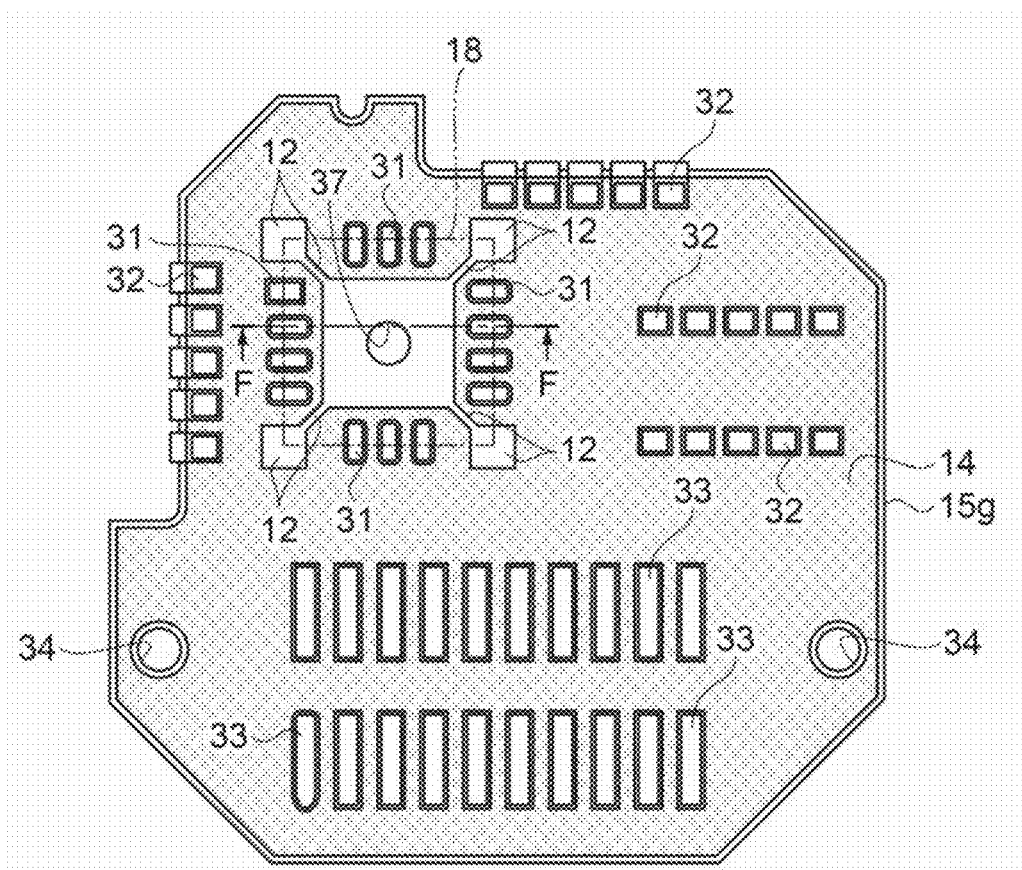
FIG. 16A is a plan view showing a disposition pattern of an insulating layer of a circuit board according to modification 6.
Figure 16B:
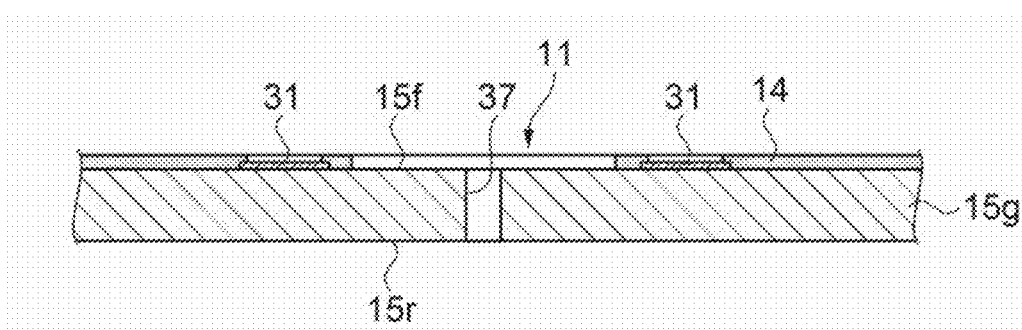
FIG. 16B is a sectional view of FIG. 16A taken along line F-F.

A modification 6 of the first region and the second region is explained with reference to FIGS. 16A and 16B. FIG. 16A is a plan view showing a disposition pattern of an insulating layer of a circuit board according to the modification 6. FIG. 16B is an F-F sectional view of FIG. 16A.

As shown in FIGS. 16A and 16B, a disposition pattern of the insulating layer 14 of a circuit board 15g according to the modification 6 includes the first region 11 present in a center region further on the inner side than the electrode pads 31, on which the acceleration sensor 18 is mounted, and provided in a position overlapping the center of the acceleration sensor 18. Further, the disposition pattern of the insulating layer 14 of the circuit board 15g according to the modification 6 includes the second regions 12, which are regions extending from the first region 11 to the outer side of the outer peripheral edge of the acceleration sensor 18 in the positions at the four corners of the outer peripheral edge of the acceleration sensor 18. The first region 11 and the second regions 12 are regions where the insulating layer 14 is not disposed. In the modification 6, a through-hole 37 piercing through from the first surface 15f to the second surface 15r of the circuit board 15g is provided in the center of the first region 11.

In the disposition pattern of the circuit board 15g and the insulating layer 14 according to the modification 6 explained above, the through-hole 37 is provided in the center of the first region 11, which is the region where the insulating layer 14 is not provided. Since the through-hole 37 is provided in this way, it is possible to cause the cleaning liquid for remaining foreign matters to flow into and discharge the cleaning liquid from the first region 11 between the acceleration sensor 18 and the circuit board 15g through the through-hole 37. Therefore, it is possible to improve the cleaning effect for the remaining foreign matters and eliminate the foreign matters.

Vehicle Positioning Device

Figure 17:
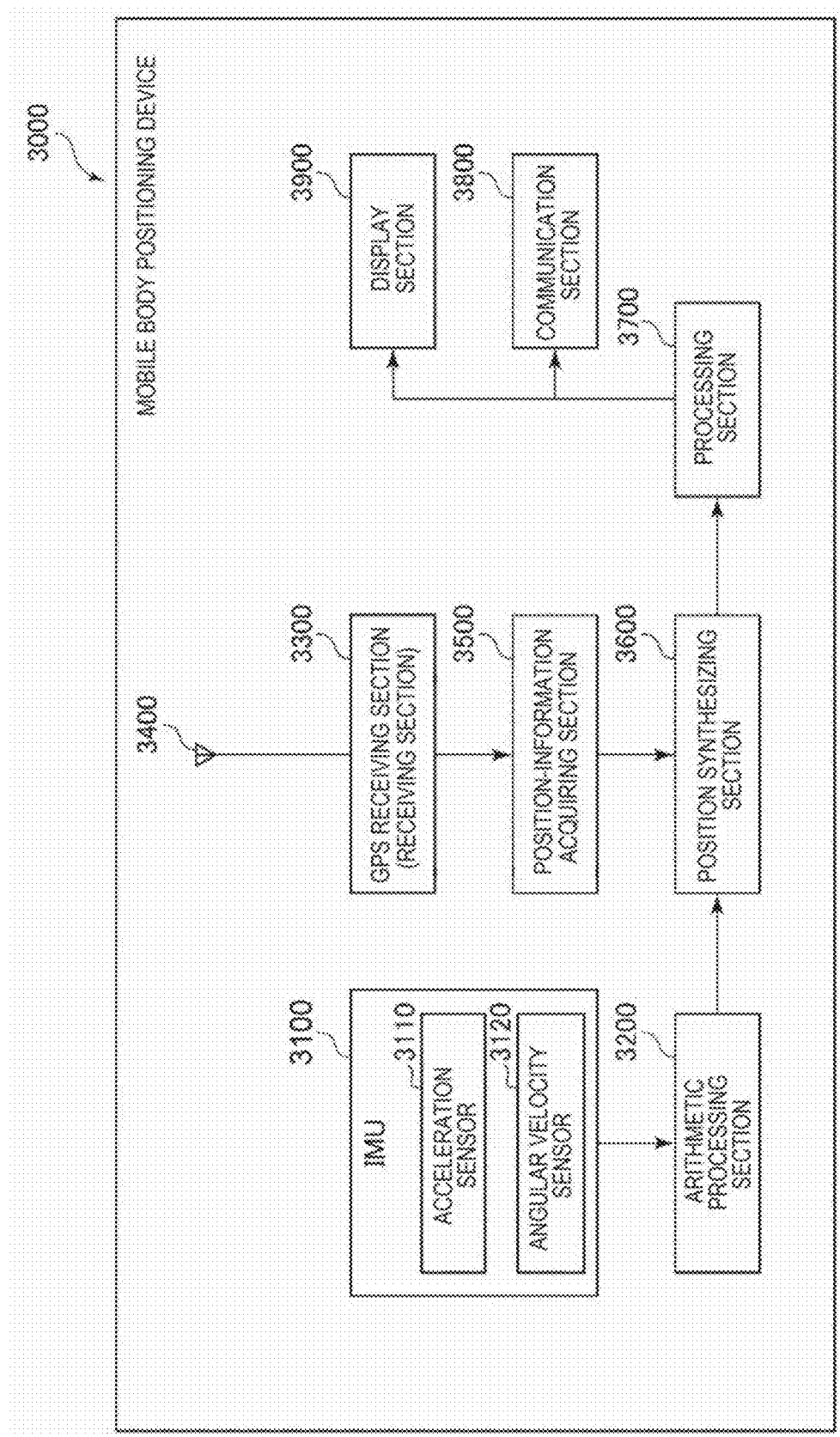
FIG. 17 is a block diagram showing an overall system of a vehicle positioning device.
Figure 18:
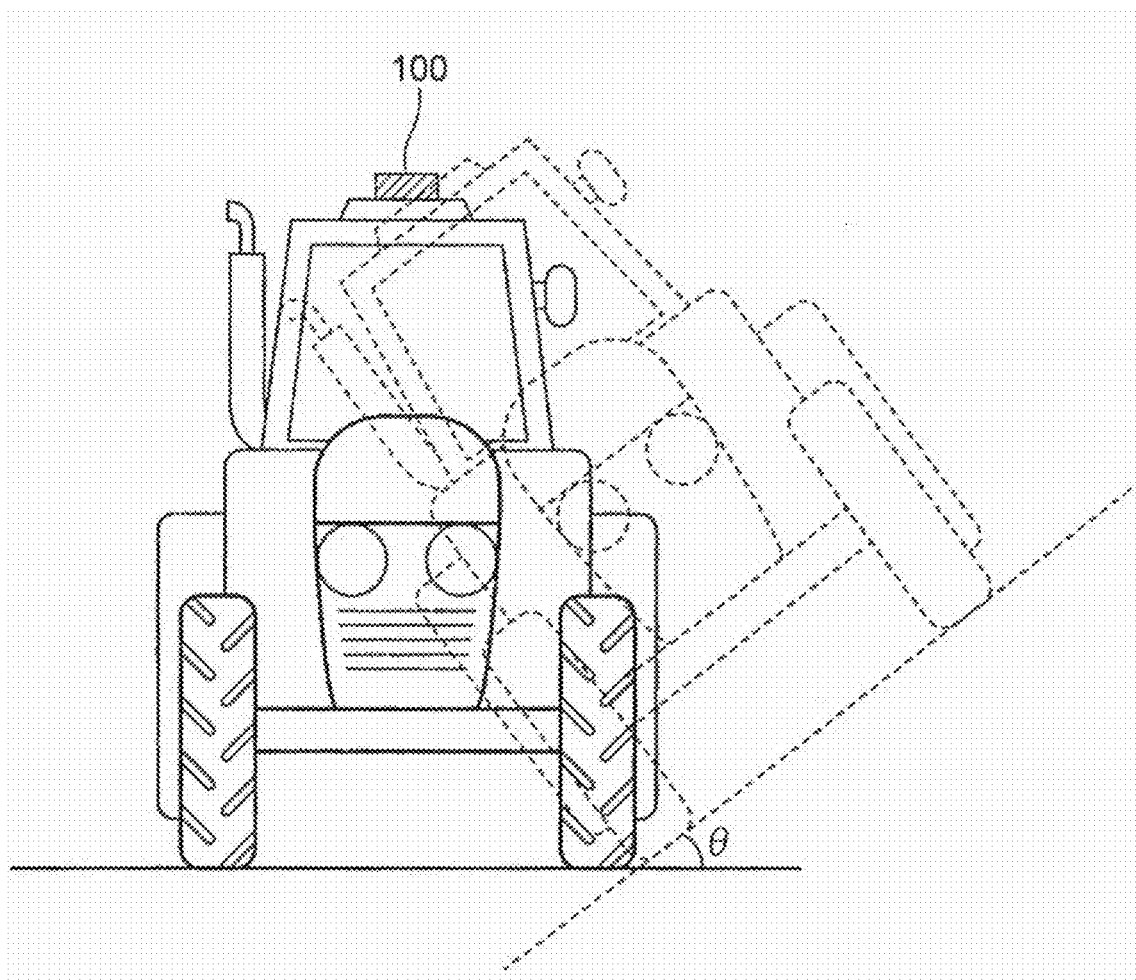
FIG. 18 is a front view schematically showing the action of the vehicle positioning device.

A vehicle positioning device is explained with reference to FIGS. 17 and 18. FIG. 17 is a block diagram showing an overall system of the vehicle positioning device. FIG. 18 is a diagram schematically showing action of the vehicle positioning device.

A vehicle positioning device 3000 shown in FIG. 17 is a device attached to a vehicle and used to perform positioning of the vehicle. The vehicle is not particularly limited and may be any one of a bicycle, an automobile (including a four-wheeled automobile and a motorbike), a train, an airplane, a ship, and the like. However, in this embodiment, the vehicle is explained as a four-wheeled automobile. The vehicle positioning device 3000 includes an inertial measurement unit 3100 (IMU), an arithmetic processing section 3200, a GPS receiving section 3300, a reception antenna 3400, a position-information acquiring section 3500, a position synthesizing section 3600, a processing section 3700, a communication section 3800, and a display section 3900. As the inertial measurement unit 3100, for example, the sensor unit 100 explained above can be used.

The inertial measurement unit 3100 includes a three-axis acceleration sensor 3110 and a three-axis angular velocity sensor 3120. The arithmetic processing section 3200 receives acceleration data from the acceleration sensor 3110 and receives angular velocity data from the angular velocity sensor 3120, performs inertial navigation arithmetic processing on these data, and outputs inertial navigation positioning data (data including acceleration and a posture of the vehicle).

The GPS receiving section 3300 receives a signal (a GPS carrier wave; a satellite signal superimposed with position information) from a GPS satellite via the reception antenna 3400. The position-information acquiring section 3500 outputs GPS positioning data representing the position (latitude, longitude, and altitude), the speed, the orientation of the vehicle positioning device 3000 (the vehicle) on the basis of the signal received by the GPS receiving section 3300. The GPS positioning data includes status data indicating a reception state, reception time, and the like.

The position synthesizing section 3600 calculates, on the basis of the inertial navigation positioning data output from the arithmetic processing section 3200 and the GPS positioning data output from the position-information acquiring section 3500, the position of the vehicle, specifically, in which position on the ground the vehicle is traveling. For example, even if the position of the vehicle included in the GPS positioning data is the same, if a posture of the vehicle is different according to the influence of inclination or the like of the ground as shown in FIG. 18, the vehicle is traveling in a different position on the ground. Therefore, an accurate position of the vehicle cannot be calculated only with the GPS positioning data. Therefore, the position synthesizing section 3600 calculates, using the inertial navigation positioning data (in particular, data concerning the posture of the vehicle), in which position on the ground the vehicle is traveling.

The calculation can be relatively easily performed by an arithmetic operation using a trigonometric function (a tilt with respect to the vertical direction is θ).

The position data output from the position synthesizing section 3600 is subjected to predetermined processing by the processing section 3700 and displayed on the display section 3900 as a positioning result. The position data may be transmitted to an external device by the communication section 3800.

The vehicle positioning device 3000 is explained above. As explained above, such a vehicle positioning device 3000 includes the inertial measurement unit 3100 applied with the sensor unit 100 explained above, the GPS receiving section 3300 (a receiving section) configured to receive a satellite signal superimposed with position information from a positioning satellite, the position-information acquiring section 3500 (an acquiring section) configured to acquire position information of the GPS receiving section 3300 on the basis of the received satellite signal, the arithmetic processing section 3200 (a computing section) configured to compute a posture of the vehicle on the basis of inertial navigation positioning data (inertial data) output from the inertial measurement unit 3100, and the position synthesizing section 3600 (a calculating section) configured to calculate a position of the vehicle by correcting the position information on the basis of the computed posture. Consequently, it is possible to enjoy the effects of the sensor unit 100 (the inertial measurement unit: IMU) explained above. The vehicle positioning device 3000 having high reliability is obtained.

Electronic Device

Figure 19:
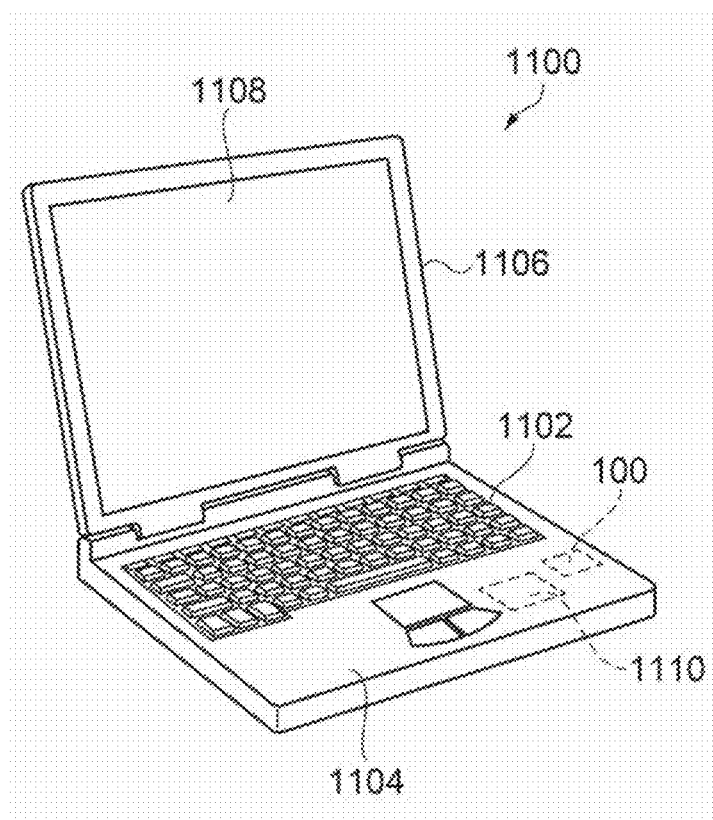
FIG. 19 is a perspective view schematically showing the configuration of a mobile personal computer, which is an example of an electronic device.
Figure 20:
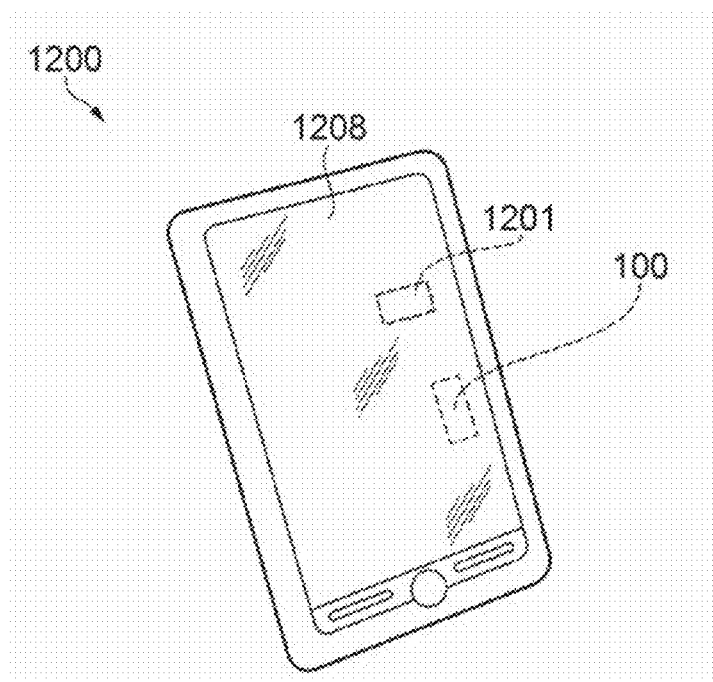
FIG. 20 is a perspective view schematically showing the configuration of a smartphone (a portable telephone), which is an example of the electronic device.
Figure 21:
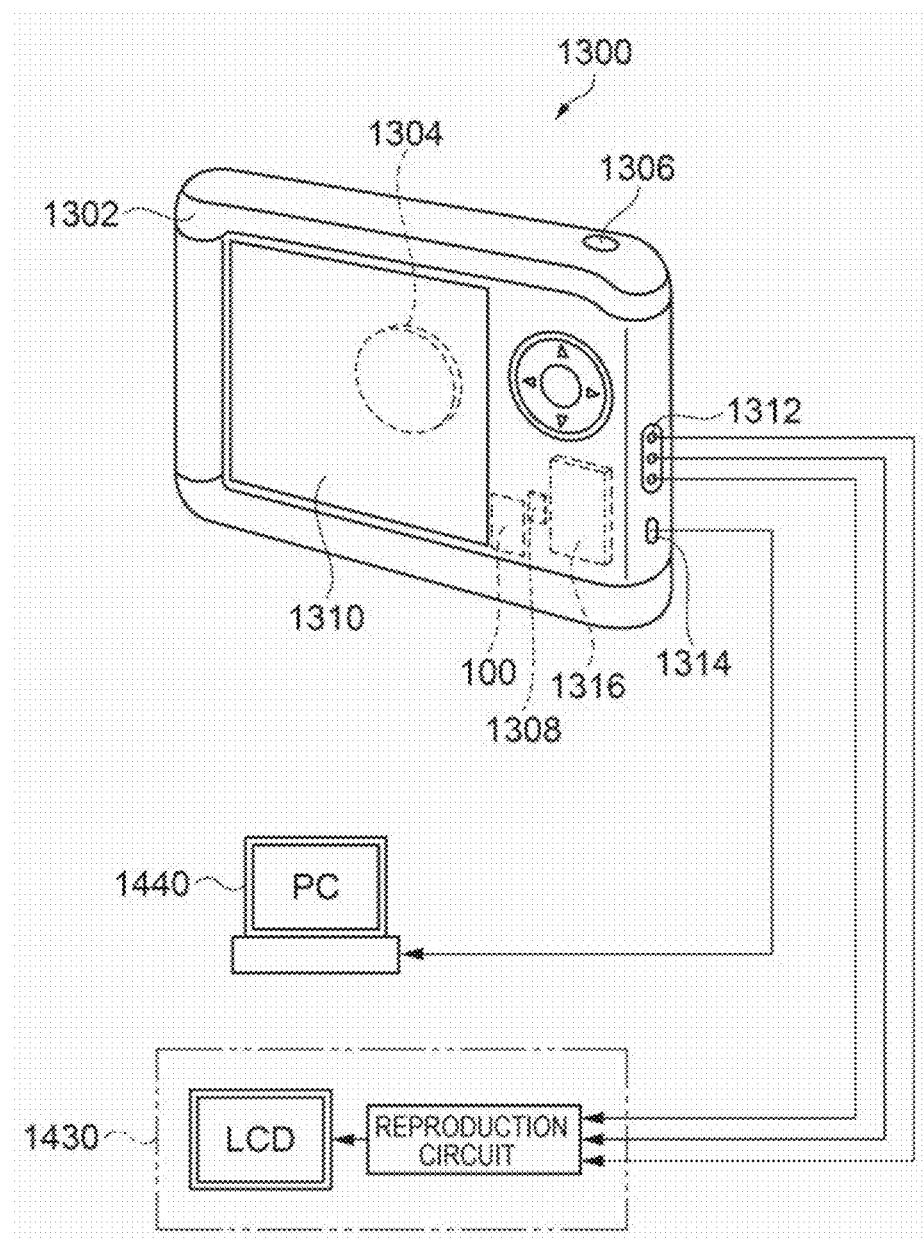
FIG. 21 is a perspective view showing the configuration of a digital still camera, which is an example of the electronic device.

An electronic device including the sensor unit 100 is explained in detail on the basis of FIGS. 19 to 21.

First, a mobile personal computer, which is an example of the electronic device, is explained with reference to FIG. 19. FIG. 19 is a perspective view schematically showing the configuration of the mobile personal computer, which is an example of the electronic device.

In this figure, a personal computer 1100 is configured by a main body section 1104 including a keyboard 1102 and a display unit 1106 including a display section 1108. The display unit 1106 is turnably supported with respect to the main body section 1104 via a hinge structure section. The sensor unit 100 functioning as the inertial measurement unit is incorporated in such a personal computer 1100. A control section 1110 can perform control such as posture control on the basis of detection data of the sensor unit 100.

A smartphone (a portable telephone), which is an example of the electronic device, is explained with reference to FIG. 20. FIG. 20 is a perspective view schematically showing the configuration of the smartphone (the portable telephone), which is an example of the electronic device.

In this figure, the sensor unit 100 explained above is incorporated in a smartphone 1200. Detection data (acceleration data and angular velocity data) detected by the sensor unit 100 is transmitted to a control section 1201 of the smartphone 1200. The control section 1201 includes a CPU (Central Processing Unit). The control section 1201 can recognize a posture and a behavior of the smartphone 1200 from the received detection data, change a display image displayed on a display section 1208, emit alarm sound and sound effect, and drive a vibration motor to vibrate a main body. In other words, the control section 1201 can perform motion sensing of the smartphone 1200, change display content from a measured posture and a measured behavior, and generate sound, vibration, and the like. In particular, when a game application is executed, a user can enjoy presence closer to reality.

A digital still camera, which is an example of the electronic device, is explained with reference to FIG. 21. FIG. 21 is a perspective view showing the configuration of the digital still camera, which is an example of the electronic device. In this figure, connection to an external device is briefly shown.

A display section 1310 is provided on the back of a case (a body) 1302 of a digital still camera 1300. The display section 1310 is configured to perform display on the basis of an imaging signal output by a CCD. The display section 1310 also functions as a finder that displays an object and an electronic image. A light receiving unit 1304 including an optical lens (an imaging optical system) and a CCD is provided on the front surface side (the rear surface side in FIG. 21) of the case 1302.

When a photographer confirms an object image displayed on the display section 1310 and presses a shutter button 1306, an imaging signal of the CCD at that point in time is transferred to and stored in a memory 1308. In this digital still camera 1300, video signal output terminals 1312 and an input/output terminal for data communication 1314 are provided on a side surface of the case 1302. As shown in FIG. 21, a television monitor 1430 is connected to the video signal output terminals 1312 according to necessity. A personal computer 1440 is connected to the input/output terminal for data communication 1314 according to necessity. Further, an imaging signal stored in the memory 1308 is output to the television monitor 1430 and the personal computer 1440 according to predetermined operation. The sensor unit 100 functioning as the inertial measurement unit is incorporated in the digital still camera 1300. A control section 1316 can perform control such as camera shake correction on the basis of detection data of the sensor unit 100.

Such an electronic device has excellent reliability because the electronic device includes the sensor unit 100 and the control section 1110, 1201, and 1316.

The electronic device including the sensor unit 100 can be applied to, besides the personal computer shown in FIG. 19, the smartphone (the portable telephone) shown in FIG. 20, and the digital still camera shown in FIG. 21, for example, a tablet terminal, a watch, an inkjet ejecting device (e.g., an inkjet printer), a laptop personal computer, a television, a video camera, a video tape recorder, a car navigation device, a pager, an electronic notebook (including an electronic notebook having a communication function), an electronic dictionary, an electronic calculator, an electronic game device, a word processor, a workstation, a videophone, a television monitor for crime prevention, an electronic binocular, a POS terminal, medical devices (e.g., an electronic thermometer, a manometer, a blood glucose meter, an electrocardiographic device, an ultrasonic diagnosis device, and an electronic endoscope), a fish finder, various measurement devices, meters (e.g., meters of a vehicle, an airplane, and a ship), a flight simulator, a seismometer, a pedometer, a clinometer, a vibration meter that measures vibration of a hard disk, a posture control device for a robot and a flying body such as a drone, a control device used for inertial navigation for automatic driving of an automobile, and the like.

Portable Electronic Device

A portable electronic device including the sensor unit 100 is explained in detail with reference to FIGS. 22 and 23. A wristwatch-type activity meter (an active tracker) is explained below as an example of the portable electronic device.

Figure 22:
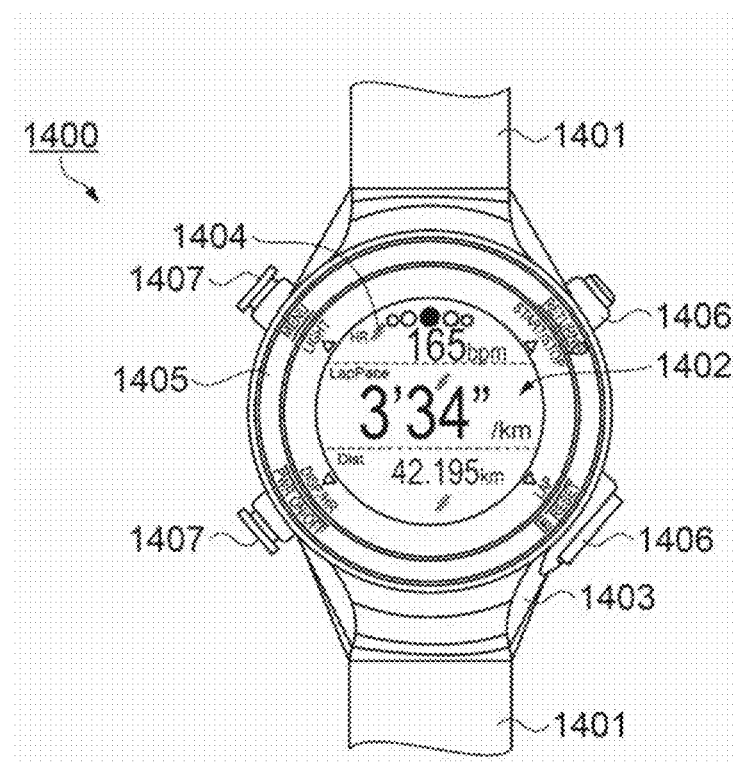
FIG. 22 is a plan view schematically showing the configuration of a portable electronic device.
Figure 23:
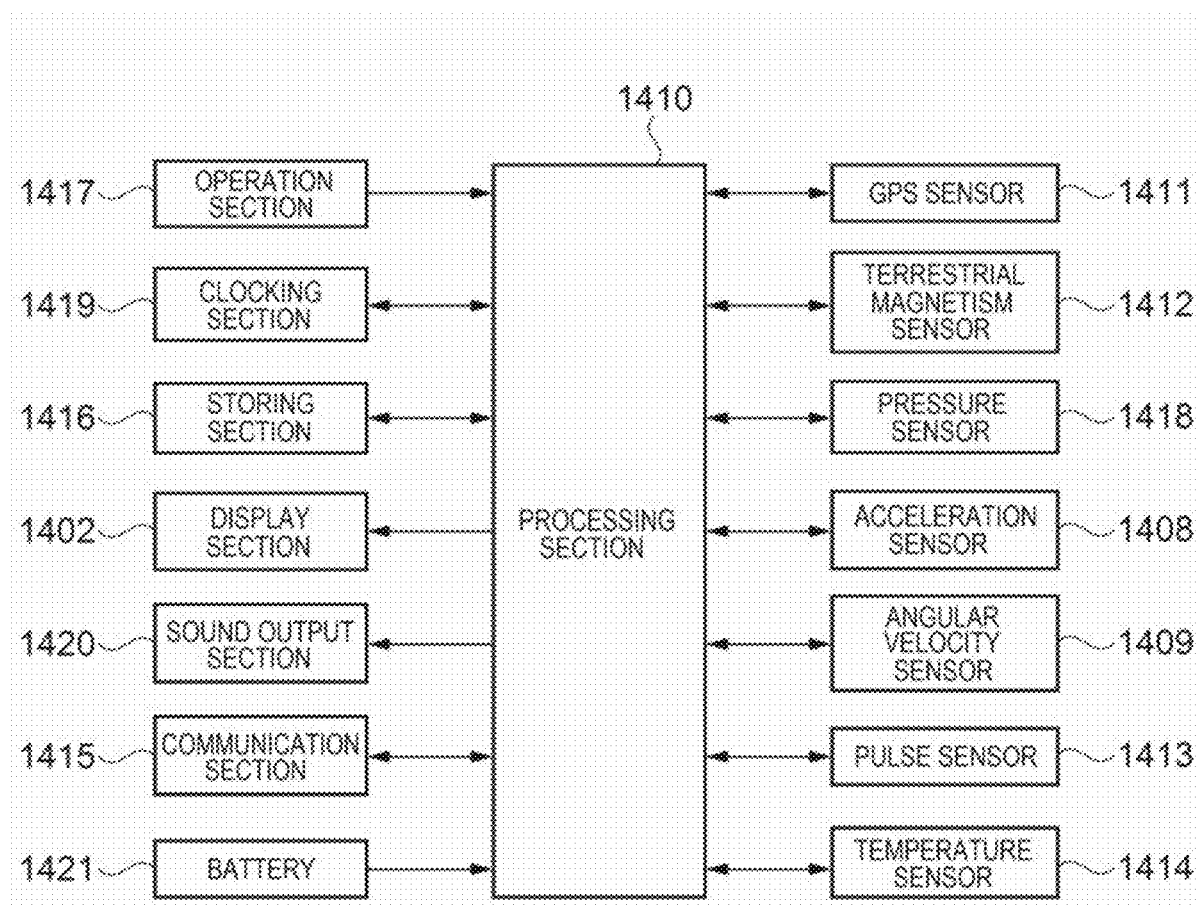
FIG. 23 is a functional block diagram showing a schematic configuration of the portable electronic device.

As shown in FIG. 22, a wrist device 1400, which is the wristwatch-type activity meter (the active tracker), is worn on a part (a subject) such as a wrist of a user by a band 1401. The wrist device 1400 includes a digital display section 1402 and is capable of performing wireless communication. The sensor unit 100 according to the invention explained above is incorporated in the wrist device 1400 together with other sensors and the like as a sensor that measures acceleration and angular velocity.

The wrist device 1400 includes a case 1403 in which at least the sensor unit 100 (not shown in FIG. 22) is housed, a processing section 1410 (see FIG. 23) housed in the case 1403 and configured to process output data from the sensor unit 100, the display section 1402 housed in the case 1403, and a light transmissive cover 1404 closing an opening section of the case 1403. A bezel 1405 is provided on the outer circumferential side located on the case 1403 side of the light transmissive cover 1404. A plurality of operation buttons 1406 and 1407 are provided on a side surface of the case 1403. The wrist device 1400 is explained more in detail below with reference to FIG. 23 as well.

An acceleration sensor 1408 included in the sensor unit 100 detects accelerations in respective three axial directions crossing (ideally, orthogonal to) one another and outputs signals (acceleration signals) corresponding to the magnitudes and the directions of the detected three-axis accelerations. An angular velocity sensor 1409 included in the sensor unit 100 detects respective angular velocities in respective three axial directions crossing (ideally, orthogonal to) one another and outputs signals (angular velocity signals) corresponding to the magnitudes and the directions of the detected three-axis angular velocities.

A liquid crystal display (LCD) configuring the display section 1402 displays, according to various detection modes, for example, position information obtained using a GPS sensor 1411 and a terrestrial magnetism sensor 1412, exercise information such as a movement amount and an exercise amount obtained using the acceleration sensor 1408 or the angular velocity sensor 1409, biological information such as a pulse rate obtained using a pulse sensor 1413, time information such as present time, or the like. The liquid crystal display can also display an environmental temperature obtained using a temperature sensor 1414.

A communication section 1415 performs various kinds of control for establishing communication between a user terminal and a not-shown information terminal. The communication section 1415 includes a transceiver corresponding to a short range wireless communication standard such as a Bluetooth (registered trademark) (including BTLE: Bluetooth Low Energy), Wi-Fi (registered trademark) (Wireless Fidelity), ZigBee (registered trademark), NFC (Near field communication), or ANT+ (registered trademark) and a connector corresponding to a communication bus standard such as a USB (Universal Serial Bus).

The processing section 1410 (a processor) is configured by, for example, an MPU (Micro Processing Unit), a DSP (Digital Signal Processor), or an ASIC (Application Specific Integrated Circuit). The processing section 1410 executes various kinds of processing on the basis of computer programs stored in a storing section 1416 and signals input from an operation section 1417 (e.g., operation buttons 1406 and 1407). The processing executed by the processing section 1410 includes data processing for output signals of a satellite positioning system including the GPS sensor 1411, the terrestrial magnetism sensor 1412, a pressure sensor 1418, the acceleration sensor 1408, the angular velocity sensor 1409, the pulse sensor 1413, the temperature sensor 1414, and a clocking section 1419, display processing for causing the display section 1402 to display an image, sound output processing for causing a sound output section 1420 to output sound, communication processing for performing communication with an information terminal via the communication section 1415, and power control processing for supplying electric power from a battery 1421 to the respective sections.

Such a wrist device 1400 can have at least the following functions.

1. Moving distance: measuring a total distance and a moving track from a measurement start with a highly accurate GPS function.
2. Pace: displaying a present traveling pace from a pace distance measurement value.
3. Average speed: calculating and displaying average speed from a traveling start to the present.
4. Altitude: measuring and displaying altitude with a GPS function.
5. Stride: measuring and displaying a stride even in a tunnel and the like where a GPS radio wave does not reach.
6. Pitch: measuring and displaying a pitch per one minute.
7. Heart rate: measuring and displaying a heart rate with a pulse sensor.
8. Gradient: measuring and displaying a gradient of the ground in training and trail running in a mountainous area.
9. Auto lap: automatically performing lap measurement when traveling a fixed distance or a fixed time set beforehand.
10. Exercise consumed calorie: displaying consumed calorie.
11. Steps: displaying a total of steps from an exercise start.

The wrist device 1400 can be widely applied to a running watch, a runner's watch, a runner's watch adapted to multiple sports such as duathlon and triathlon, an outdoor watch, and a GPS watch mounted with a satellite positioning system, for example, a GPS.

In the above explanation, the GPS (Global Positioning System) is used as the satellite positioning system. However, another global navigation satellite system (GNSS) may be used. For example, one or two or more of satellite positioning systems such as an EGNOS (European Geostationary-Satellite Navigation Overlay Service), a QZSS (Quasi Zenith Satellite System), a GLONASS (Global Navigation Satellite System), a GALILEO, and a BeiDou (BeiDou Navigation Satellite system) may be used. A satellite-based augmentation system (SBA) such as a WARS (Wide Area Augmentation System) or an EGNOS (European Geostationary-Satellite Navigation Overlay Service) may be used in at least one of the satellite positioning systems.

Such a wrist device 1400 functioning as the portable electronic device has excellent reliability because the wrist device 1400 includes the sensor unit 100 and the processing section 1410.

Vehicle

Figure 24:
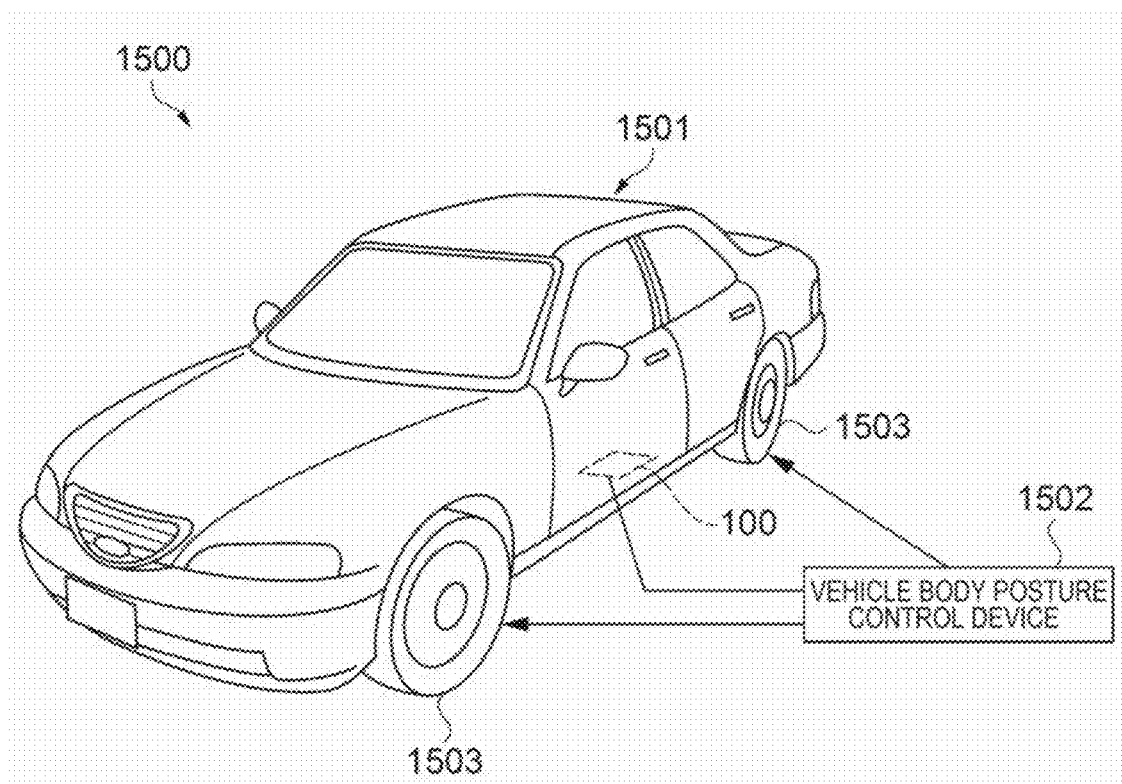
FIG. 24 is a perspective view showing the configuration of an automobile, which is an example of a vehicle.

A vehicle including the sensor unit 100 is explained in detail with reference to FIG. 24. FIG. 24 is a perspective view showing the configuration of an automobile, which is an example of the vehicle.

As shown in FIG. 24, the sensor unit 100 is incorporated in an automobile 1500. For example, a posture of a vehicle body 1501 can be detected by the sensor unit 100.

A detection signal of the sensor unit 100 is supplied to a vehicle body posture control device 1502 functioning as a control section that controls a posture of the vehicle body. The vehicle body posture control device 1502 can detect a posture of the vehicle body 1501 on the basis of the signal, control hardness of a suspension according to a result of the detection, and function as a brake system to control brakes of respective wheels 1503. Besides, the sensor unit 100 can be widely applied to a keyless entry system, an immobilizer, a car navigation system, a car air conditioner, an antilock brake system (ABS), an airbag, a tire pressure monitoring system (TPMS), an engine control system (an engine system), a control device for inertial navigation for automobiles, and an electronic control unit (ECU) for a battery monitor and the like of a hybrid automobile and an electric automobile.

Besides the illustrations explained above, the sensor unit 100 applied to the vehicle can be used in posture control of a bipedal walking robot, a train, and the like, posture control of remote-controlled or autonomous flying bodies such as radio-controlled airplane, a radio-controlled helicopter, and a drone, posture control of an agricultural machine, a construction machine, and the like, and control of a rocket, an artificial satellite, a ship, an AGV (automatic guided vehicle), and the like. As explained above, in realizing the posture control of the various vehicles, the sensor unit 100 and control sections (not shown in FIG. 24) of the vehicles are incorporated in the vehicles.

Such a vehicle has excellent reliability because the vehicle includes the sensor unit 100 and the control section (e.g., the vehicle body posture control device 1502 functioning as the posture control section).

Traveling Supporting System

Figure 25:
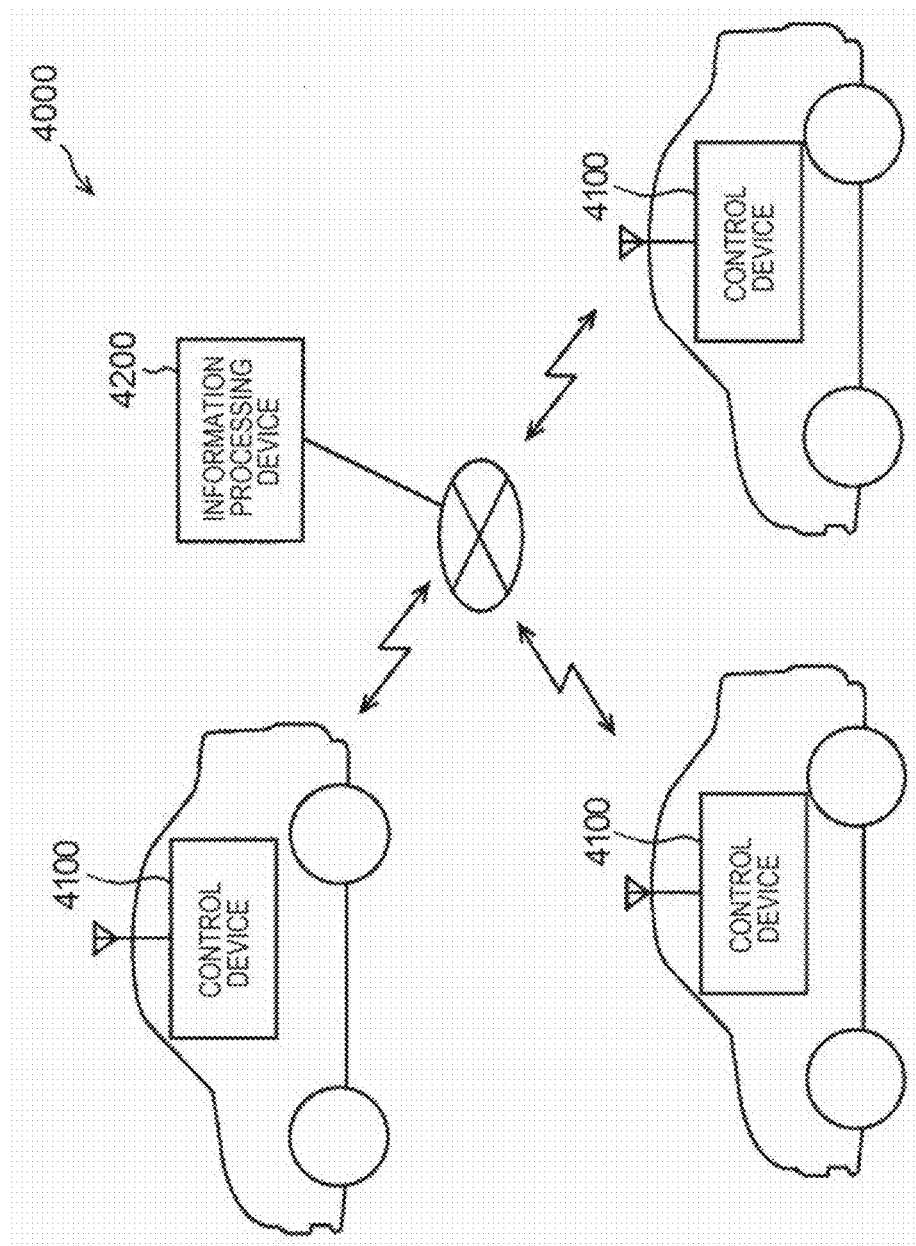
FIG. 25 is a diagram showing a schematic configuration of a traveling supporting system.
Figure 26:
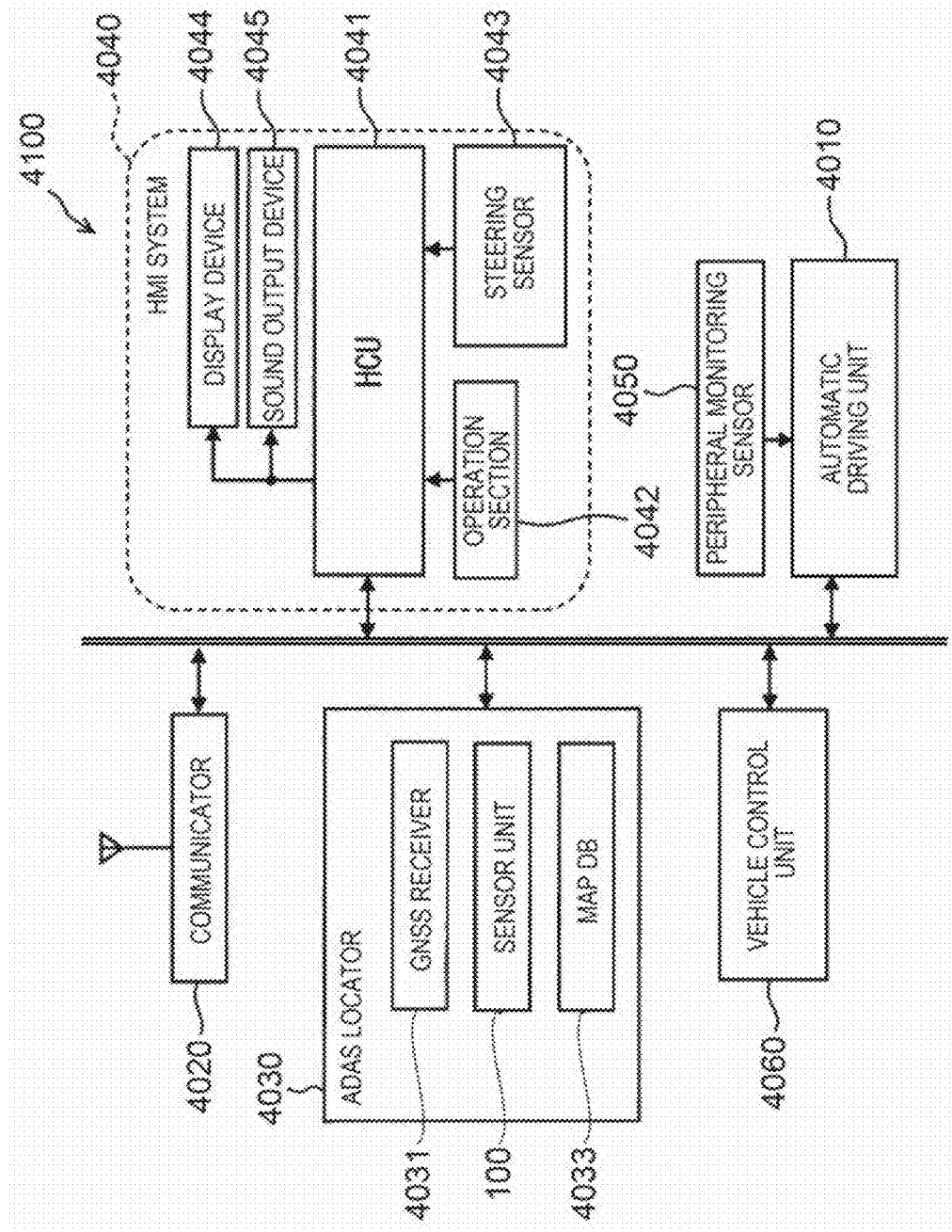
FIG. 26 is a functional block diagram showing a schematic configuration of the traveling supporting system.

A traveling supporting system including the sensor unit 100 is explained below with reference to FIGS. 25 and 26. FIG. 25 is a diagram showing a schematic configuration of the traveling supporting system. FIG. 26 is a functional block diagram showing the schematic configuration of the traveling supporting system.

Schematic Configuration of the Traveling Supporting System

As shown in FIG. 25, a traveling supporting system 4000 includes control devices 4100 respectively mounted on a plurality of vehicles and an information processing device 4200.

The control device 4100 is mounted on a vehicle that performs automatic driving for automatically controlling at least any one of acceleration, braking, and steering (hereinafter, automatic driving vehicle) and performs communication with the information processing device 4200. The information processing device 4200 is, for example, a server device. The information processing device 4200 collects vehicle information transmitted from the control devices 4100 mounted on a plurality of automatic driving vehicles and transmits information obtained on the basis of the collected vehicle information to the control devices 4100. The information processing device 4200 may be configured from one server device or may be configured from a plurality of server devices.

Schematic Configuration of the Control Device

A schematic configuration of the control device 4100 is explained with reference to FIG. 26. The control device 4100 is mounted on an automatic driving vehicle. As shown in FIG. 26, the control device 4100 includes an automatic driving unit 4010, a communicator 4020, an ADAS (Advanced Driver Assistance Systems) locator 4030, an HMI (Human Machine Interface) system 4040, a periphery monitoring sensor 4050, and a vehicle control unit 4060. The automatic driving unit 4010 functioning as a control section, the communicator 4020, the ADAS locator 4030, the HMI system 4040, and the vehicle control unit 4060 are connected to, for example, an in-vehicle LAN and can exchange information with one another through communication.

The communicator 4020 performs communication with the outside of the vehicle. The communicator 4020 can perform wireless communication with, for example, at least one of a vehicle-mounted communicator mounted on a peripheral vehicle of the vehicle and a roadside machine set on a roadside. For example, the communicator 4020 can acquire position information, traveling speed information, and the like of the peripheral vehicle of the vehicle through inter-vehicle communication with the vehicle-mounted communicator and the roadside machine.

The communicator 4020 performs communication with the information processing device 4200. When performing communication with the information processing device 4200, the communicator 4020 only has to be configured to perform communication with the information processing device 4200 with a vehicle-mounted communication module used for telematics communication such as a DCM (Data Communication Module) via a communication network used in the telematics communication. The communicator 4020 may be configured to perform communication with the information processing device 4200 via the roadside machine and a communication network between the roadside machine and the information processing device 4200. The communicator 4020 outputs information acquired from the information processing device 4200 to the in-vehicle LAN and transmits vehicle information transmitted from the automatic driving unit 4010 via the in-vehicle LAN.

A vehicle-mounted communication module that performs wireless communication with at least one of the vehicle-mounted communicator mounted on the peripheral vehicle and the roadside machine set on the roadside and the vehicle-mounted communication module used for the telematics communication may be separately provided or may be integrally provided.

The ADAS locator 4030 includes a GNSS (Global Navigation Satellite System) receiver 4031, the sensor unit 100 explained above, and a map database (hereinafter, DB) 4033 in which map data is stored. The GNSS receiver 4031 receives positioning signals from a plurality of artificial satellites. The sensor unit 100 includes, for example, a three-axis gyro sensor and a three-axis acceleration sensor. The map DB 4033 is a nonvolatile memory and has stored therein map data such as link data, node data, road shapes, and structures.

The ADAS locator 4030 combines a positioning signal received by the GNSS receiver 4031 and a measurement result of the sensor unit 100 to thereby sequentially position vehicle positions of the vehicle mounted with the ADAS locator 4030. For the positioning of the vehicle position, a traveling distance calculated from pulse signals sequentially output from a wheel speed sensor (not shown in FIG. 26) mounted on the vehicle may also be used. The ADAS locator 4030 outputs the positioned vehicle position to the in-vehicle LAN. The ADAS locator 4030 reads out the map data from the map DB 4033 and outputs the map data to the in-vehicle LAN. The ADAS locator 4030 may acquire map data from the outside of the vehicle using a vehicle-mounted communication module (not shown in FIG. 26) such as a DCM mounted on the vehicle.

The HMI system 4040 includes, as shown in FIG. 26, an HCU (Human Machine Interface Control Unit) 4041, an operation section 4042, a steering sensor 4043, a display device 4044, and a sound output device 4045. The HMI system 4040 receives input operation from a driver of the vehicle, presents information to the driver of the vehicle, and detects a state of the driver of the vehicle.

The operation section 4042 is a switch group operated by the driver of the vehicle. The operation section 4042 is used for performing various kinds of setting. For example, as the operation section 4042, there are a steering switch provided in a spoke section a steering wheel of the vehicle, a touch switch integrated with the display device 4044, and the like.

The steering sensor 4043 is a sensor for detecting that an occupant is touching the steering wheel of the vehicle. Examples of the steering sensor 4043 include a touch sensor provided in the steering wheel and a steering torque sensor that detects steering torque of the steering wheel of the vehicle. A detection result in the steering sensor 4043 is output to the HCU 4041.

As the display device 4044, there are, for example, a combination meter, a CID (Center Information Display), and an HUD (Head-Up Display). The combination meter is disposed in front of a driver's seat of the vehicle. The CID is disposed above a center cluster in a vehicle interior of the vehicle. The combination meter and the CID display various images for information presentation on a display screen of a display on the basis of image data acquired from the HCU 4041. The HUD projects light of an image based on the image data acquired from the HCU 4041 onto a projection region specified in a windshield of the vehicle. The light of the image reflected to the vehicle interior side by the windshield is sensed by the driver seated on the driver's seat. The driver is capable of visually recognizing a virtual image of the image projected by the HUD while superimposing the virtual image on an external scene in front of the vehicle.

As the sound output device 4045, there is, for example, an audio speaker. The audio speaker is disposed in, for example, a lining of a door of the vehicle. The audio speaker presents information to the occupant such as the driver with reproduced sound.

The HCU 4041 includes a CPU, memories such as a ROM and a RAM, an I/O, and a bus that connects the foregoing. The HCU 4041 executes a control program stored in the memories to execute various kinds of processing. For example, the HCU 4041 causes, according to an instruction from the automatic driving unit 4010, at least one of the display device 4044 and the sound output device 4045 to present information. A part or all of functions executed by the HCU 4041 may be configured in a hardware manner by one or a plurality of ICs or the like.

The periphery monitoring sensor 4050 detects obstacles including moving objects such as pedestrians, animals other than humans, bicycles, motorbikes, and other vehicles and stationary objects such as fallen objects on roads, guardrails, curbstones, and trees. Besides, the periphery monitoring sensor 4050 detects road markings such as traveling section lines and stop lines. The periphery monitoring sensor 4050 is a sensor such as a periphery monitoring camera that images a predetermined range around the vehicle, a millimeter wave radar that transmits a probing wave to a predetermined range around the vehicle, a sonar, or an LIDAR (Light Detection and Ranging/Laser Imaging Detection and Ranging).

As the periphery monitoring camera, a stereo camera may be used or a monocular camera may be used. The periphery monitoring camera sequentially outputs sequentially captured images to the automatic driving unit 4010 as sensing information. The sensor that transmits a probing wave such as the sonar, the millimeter wave radar, or the LIDAR sequentially outputs scanning results based on reception signals obtained when a reflected wave reflected by an obstacle is received to the automatic driving unit 4010 as sensing information. A plurality of kinds of periphery monitoring sensors 4050 may have overlapping sensing ranges. For example, sensing of the front of the vehicle may be performed concurrently using the periphery monitoring camera and the millimeter wave radar.

The vehicle control unit 4060 is an electronic control device that performs at least one of acceleration and deceleration control and steering control of the vehicle. As the vehicle control unit 4060, there are a steering ECU that performs the steering control, a power unit control ECU that performs the acceleration and deceleration control, a brake ECU, and the like. The vehicle control unit 4060 acquires detection signals output from sensors such as an accelerator position sensor, a brake stepping force sensor, a steering angle sensor, and a wheel speed sensor and outputs control signals to traveling control devices such as an electronic control throttle, a brake actuator, an EPS (Electric Power Steering) motor. The vehicle control unit 4060 is capable of outputting the detection signals of the sensors to the in-vehicle LAN.

The automatic driving unit 4010 functioning as the control section includes a CPU, a volatile memory, a nonvolatile memory, an I/O, and a bus that connects the foregoing. The automatic driving unit 4010 executes a control program stored in the nonvolatile memory to execute various kinds of processing. For example, the automatic driving unit 4010 recognizes a traveling environment of the vehicle from a sensing result in the periphery monitoring sensor 4050. Besides, the automatic driving unit 4010 controls the vehicle control unit 4060 to thereby execute driving operation on behalf of the driver. The automatic driving unit 4010 is equivalent to a traveling supporting device. Apart or all of functions executed by the automatic driving unit 4010 may be configured in a hardware manner by one or a plurality of ICs or the like.

The automatic driving unit 4010 functioning as the control section can instruct the vehicle control unit 4060 on the basis of a detection signal detected by the sensor unit 100 to control at least any one of acceleration, braking, and steering. The automatic driving unit 4010 can switch, according to a change of the detection signal detected by the sensor unit 100, whether automatic driving is carried out or not. With the automatic driving unit 4010 functioning as the control section that controls at least any one of acceleration, braking, and steering, it is possible to accurately switch, according to a change of the detection signal detected by the sensor unit 100, whether automatic driving is carried out or not.

Such a traveling supporting system 4000 has excellent reliability because the traveling supporting system 4000 includes the sensor unit 100 and the automatic driving unit 4010 functioning as the traveling supporting device including the sensor unit 100.

Head-Mounted Display Device

Figure 27:
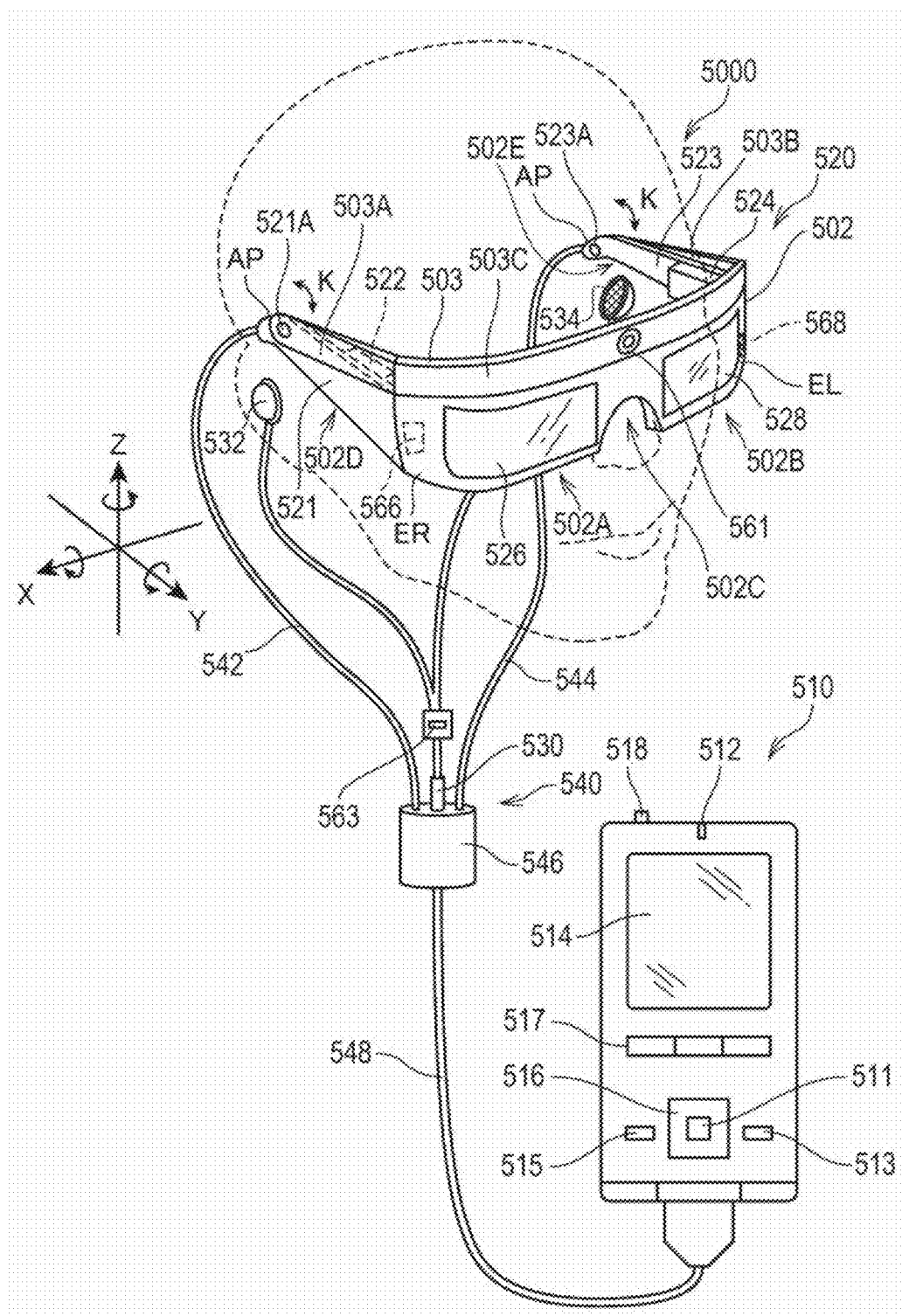
FIG. 27 is an explanatory diagram showing a schematic configuration of a head-mounted display device.

A head-mounted display device functioning as an example of a display device including the sensor unit 100 is explained below with reference to FIG. 27. FIG. 27 is an explanatory diagram showing a schematic configuration of the head-mounted display device.

As shown in FIG. 27, a head-mounted display device 5000 includes an image display section 520 configured to cause a user to visually recognize a virtual image in a state in which the image display section 520 is worn on the head of the user and a control device 510 configured to control the image display section 520. The control device 510 also functions as a controller for the user to operate the head-mounted display device 5000.

The image display section 520 is a wearing body worn on the head of the user. In this embodiment, the image display section 520 includes a frame 502 (a main body) having an eyeglass shape. The frame 502 includes a right holding section 521 and a left holding section 523. The right holding section 521 is a member provided to extend from an end portion ER, which is the other end, of a right optical-image-display section 526 to a position corresponding to the temporal region of the user when the user wears the image display section 520. Similarly, the left holding section 523 is a member provided to extend from an end portion EL, which is the other end, of a left optical-image-display section 528 to a position corresponding to the temporal region of the user when the user wears the image display section 520. The right holding section 521 is in contact with the right ear or the vicinity of the right ear on the head of the user and the left holding section 523 is in contact with the left ear or the vicinity of the left ear on the head of the user to hold the image display section 520 on the head of the user.

A right display driving section 522, a left display driving section 524, the right optical-image display section 526, the left optical-image display section 528, and a microphone 563 are provided in the frame 502. In this embodiment, the frame 502 of an eyeglass type is illustrated as an example of the main body. The shape of the main body is not limited to the eyeglass type and can be any type worn on the head of the user and fixed. The shape of the main body is more desirably a shape worn to extend in front of the left and right eyes of the user. For example, besides the eyeglass type explained here, the shape may be a snow goggles-like shape that covers an upper part of the face of the user or may be a shape disposed in front of the respective left and right eyes of the user like a binocular.

The frame 502 of the eyeglass type includes a right section 502A located in front of the right eye of the user and a left section 502B located in front of the left eye of the user. The frame 502 has a shape formed by coupling the right section 502A and the left section 502B in a bridge section 502C (a coupling section). The bridge section 502C couples the right section 502A and the left section 502B in a position corresponding to the middle of the forehead of the user when the user wears the image display section 520.

The right section 502A and the left section 502B are respectively coupled to temple sections 502D and 502E. The temple sections 502D and 502E support the frame 502 on the head of the user like temples of an eyeglass. In this embodiment, the temple section 502D is configured by the right holding section 521 and the temple section 502E is configured by the left holding section 523.

The right optical-image display section 526 is disposed in the right section 502A. The left optical-image display section 528 is disposed in the left section 502B. The right optical-image display section 526 and the left optical-image display section 528 are respectively located in front of the right and left eyes of the user when the user wears the image display section 520.

The right display driving section 522 and the left display driving section 524 are disposed on sides opposed to the head of the user when the user wears the image display section 520. The right display driving section 522 and the left display driving section 524 are collectively simply referred to as "display driving sections" as well. The right optical-image display section 526 and the left optical-image display section 528 are collectively simple referred to as "optical-image display sections" as well. The display driving sections 522 and 524 include liquid crystal displays, projection optical systems, and the like not shown in FIG. 27.

The right optical-image display section 526 and the left optical-image display section 528 include light guide plates and dimming plates not shown in FIG. 27. The light guide plates are formed of light transmissive resin. The light guide plates guide image lights output by the display driving sections 522 and 524 to the eyes of the user. The dimming plates are thin plate-like optical elements and are disposed to cover the front side of the image display section 520, which is the opposite side of the side of the eyes of the user. As the dimming plates, it is possible to use various dimming plates such as a dimming plate having almost no light transmissivity, a dimming plate nearly transparent, a dimming plate that attenuates a light amount and transmits light, and a dimming plate that attenuates or reflects light having a specific wavelength. By selecting optical characteristics (light transmittance, etc.) of the dimming plates as desired, it is possible to adjust an amount of external light made incident on the right optical-image display section 526 and the left optical-image display section 528 from the outside and adjust easiness of visual recognition of a virtual image.

In the following explanation in this embodiment, dimming plates at least having light transmissivity enough for the user wearing the image display section 520 to visually recognize an outside scene are used. The dimming plates protect a right light guide plate and a left light guide plate, which are optical elements, and prevent damage, adhesion of stain, and the like to the right light guide plate and the left light guide plate. The dimming plates may be detachably attachable to the right optical-image display section 526 and the left optical-image display section 528. A plurality of kinds of dimming plates may be able to be replaced and attached. The dimming plates may be omitted.

A camera unit 503 is provided in the frame 502. The camera unit 503 includes a camera pedestal section 503C on which an upper camera 561 is disposed and arm sections 503A and 503B configured to support the camera pedestal section 503C. The arm section 503A is turnably coupled to the right holding section 521 by a hinge 521A provided at a distal end portion AP of the right holding section 521. The arm section 503B is turnably coupled to the left holding section 523 by a hinge 523A provided at a distal end portion AP of the left holding section 523. Therefore, the camera unit 503 as a whole is turnable in a direction indicated by arrows K in FIG. 27, that is, up and down in a mounted state of the head-mounted display. The camera unit 503 is in contact with the frame 502 at a lower end of a turning range. An upper end of the turning range of the camera unit 503 is determined by, for example, specifications of the hinges 521A and 523A.

The camera pedestal section 503C is a plate-like or bar-like member located across upper parts of the right section 502A, the left section 502B, and the bridge section 502C. The upper camera 561 is embedded and set in a position above the bridge section 502C. The upper camera 561 is a digital camera including an imaging element such as a CCD or a CMOS and an imaging lens. The upper camera 561 may be a monocular camera or may be a stereo camera.

The upper camera 561 images at least a part of an outside scene in a front side direction of the head-mounted display device 5000, in other words, a visual field direction of the user in a state in which the user wears the image display section 520. The width of an angle of view of the upper camera 561 can be set as desired. However, for example, at the lower end of the turning range of the camera unit 503, an imaging range of the upper camera 561 desirably includes an external world visually recognized by the user through the right optical-image display section 526 and the left optical-image display section 528. Further, the imaging range of the upper camera 561 is more desirably set such that the upper camera 561 can image an entire visual field of the user through the dimming plates.

The image display section 520 is connected to the control device 510 via a connecting section 540. The connecting section 540 includes a main body cord 548 connected to the control device 510, a right cord 542, a left cord 544, and a coupling member 546. The right cord 542 and the left cord 544 are two cords branching from the main body cord 548. The right cord 542 is inserted into a housing of the right holding section 521 from the distal end portion AP in the extending direction of the right holding section 521 and connected to the right display driving section 522. Similarly, the left cord 544 is inserted into a housing of the left holding section 523 from the distal end portion AP in the extending direction of the left holding section 523 and connected to the left display driving section 524.

The coupling member 546 is provided at a branching point of the main body cord 548 and the right cord 542 and the left cord 544. The coupling member 546 includes a jack for connecting an earphone plug 530. Cords of a right earphone 532 and a left earphone 534 extend from the earphone plug 530. The microphone 563 is provided in the vicinity of the earphone plug 530. The cords are collected as one cord from the earphone plug 530 to the microphone 563.

The cords branch from the microphone 563 and are respectively connected to the right earphone 532 and the left earphone 534.

The microphone 563 is disposed such that a sound collecting section of the microphone 563 faces a visual line direction of the user. The microphone 563 collects sound and outputs a sound signal to a sound processing section (not shown in FIG. 27). The microphone 563 may be, for example, a monaural microphone or may be a stereo microphone, may be a microphone having directivity, or may be a nondirectional microphone.

The right cord 542, the left cord 544, and the main body cord 548 only have to be cords capable of transmitting digital data and can be configured by, for example, a metal cable or an optical fiber. The right cord 542 and the left cord 544 may be collected as one cord.

The image display section 520 and the control device 510 transmit various signals via the connecting section 540. Connectors (not shown in FIG. 27) that fit with each other are provided at the end portion of the main body cord 548 on the opposite side of the coupling member 546 and the control device 510. The control device 510 and the image display section 520 can be connected and separated by fitting the connector of the main body cord 548 and the connector of the control device 510 and releasing the fitting.

The control device 510 controls the head-mounted display device 5000. The control device 510 includes a determination key 511, a lighting section 512, a display switching key 513, a luminance switching key 515, a direction key 516, a menu key 517, and switches including a power switch 518. The control device 510 includes a track pad 514 that the user operates with a finger.

The determination key 511 detects pressing operation and outputs a signal for determining content of operation by the control device 510. The lighting section 512 includes a light source such as an LED (Light Emitting Diode) and notifies, with a lighting state of the light source, an operation state (e.g., ON/OFF of a power supply) of the head-mounted display device 5000. The display switching key 513 outputs, according to pressing operation, for example, a signal for instructing switching of a display mode of an image.

The track pad 514 includes an operation surface on which a touch operation is detected and outputs an operation signal according to the operation on the operation surface. A detection type on the operation surface is not limited. An electrostatic type, a pressure detection type, an optical type, and the like can be adopted. The luminance switching key 515 outputs, according to pressing operation, a signal for instructing an increase and a decrease in the luminance of the image display section 520. The direction key 516 outputs an operation signal according to pressing operation of the key corresponding to upper, lower, left, and right directions. The power switch 518 is a switch that switches ON/OFF of the power supply of the head-mounted display device 5000.

Two motion sensors are attached to the frame 502. The motion sensors in this embodiment are inertial sensors and are specifically a first sensor 566 and a second sensor 568. The first sensor 566 is disposed at the end on the temple section 502D side in the right section 502A. The second sensor 568 is disposed at the end on the temple section 502E side in the left section 502B. That is, the first sensor 566 and the second sensor 568 are located further on one side than the center of the head in a mounted state of the head-mounted display device 5000. The first sensor 566 and the second sensor 568 are inertial sensors such as an acceleration sensor and an angular velocity sensor (a gyro sensor). In this embodiment, the sensor unit 100 explained above including the three-axis gyro sensor and the three-axis acceleration sensor is used. The first sensor 566 and the second sensor 568 respectively detect, at measurement reference points of incorporated detecting mechanisms, for example, rotation (a pitch) around the X axis, rotation (a yaw) around the Y axis, and rotation (a roll) around the Z axis.

One sensor of the first sensor 566 and the second sensor 568 is present on one side of the center of the head of the user. The other sensor is present on the other side of the center of the head of the user. Specifically, the first sensor 566 is present on the right side of the head of the user. The second sensor 568 is present on the left side of the head of the user. In this embodiment, the center of the head indicates the center of the head on a horizontal plane perpendicular to the height of the user. The positions on the horizontal plane of the first sensor 566 and the second sensor 568 are present on the right side and the left side across the center of the head on the horizontal plane.

The head-mounted display device 5000 functioning as an example of the display device having such a configuration includes the image display section 520 configured to irradiate image light on the eyes of the user and the first sensor 566 and the second sensor 568 functioning as a plurality of motion sensors. One of the first sensor 566 and the second sensor 568 is located further on one side than the center of the head in the mounted state. The other motion sensor is located further on the other side than the center of the head in the mounted state. Therefore, when the head of the user moves, it is possible to quickly calculate a movement amount, a direction of the movement, and the like in a motion center.

In the head-mounted display device 5000, one of the first sensor 566 and the second sensor 568 is located further on the left side than the center of the head in the mounted state. The other motion sensor is located further on the right side than the center of the head in the mounted state. Therefore, it is possible to quickly calculate a movement in the motion center of the head on the basis of detection results of the motion sensors.

Such a head-mounted display device 5000 functioning as an example of the display device has excellent reliability because the head-mounted display device 5000 includes the sensor unit 100 as the first sensor 566 and the second sensor 568.

The sensor unit, the vehicle positioning device, the electronic device, the portable electronic device, the vehicle, and the display device are explained on the basis of the embodiment shown in the figures. However, the invention is not limited to the embodiment. The components of the sections can be replaced with any components having the same functions. Any other components may be added to the invention.

Contents derived from the embodiment explained above are described below as aspects.
First Aspect A sensor unit according to this aspect includes: an inertial sensor; a circuit board including, on a first surface, a plurality of electrode pads to which a plurality of mounting terminals of the inertial sensor are respectively attached via connecting members; and a case, on an inside of which the circuit board is housed. The first surface of the circuit board includes an insulating layer provided on an outer side of the plurality of electrode pads in a plan view, includes, in a portion overlapping a center region further on an inner side than the mounting terminals of the inertial sensor in the plan view, a first region where the insulating layer is not provided, and includes, from the first region to an outer side of the inertial sensor in the plan view, a second region where the insulating layer is not provided.

According to this aspect, the sensor unit includes the inertial sensor, the circuit board, and the case. The plurality of electrode pads to which the plurality of mounting terminals of the inertial sensor are respectively attached via the connecting members are provided on the first surface of the circuit board. The circuit board is housed on the inside of the case. The insulating layer is provided on the outer side of the electrode pads on the first surface of the circuit board. In other words, the electrode pads are formed in an opening section of the insulating layer. The first surface of the circuit board includes the first region and the second region where the insulating layer is not provided. The first region is the center region further on the inner side than the mounting terminals of the inertial sensor. The second region is a region extending from the first region to the outer side of the inertial sensor.

That is, by not providing the insulating layer between the center region of the inertial sensor and the circuit board, the sensor unit is configured to set an interval (a gap) between the inertial sensor and the circuit board to be larger than when the insulating layer is provided. Consequently, cleaning liquid for removing foreign matters present between the inertial sensor and the circuit board easily enters between the inertial sensor and the circuit board. It is possible to improve a cleaning effect for the foreign matters. Consequently, since the foreign matters less easily remain in the interval (the gap) between the inertial sensor and the circuit board, stress generated in the inertial sensor by a change in a state (e.g., thermal expansion or thermal contraction) of the foreign matters by a temperature change decreases. Therefore, it is possible to reduce occurrence of temperature hysteresis of a bias signal (a detection output signal) due to the remaining of the foreign matters. It is possible to provide an inertial sensor capable of performing highly accurate detection.
Second Aspect In the sensor unit according to the first aspect, it is preferable that recessed sections are provided in the first region and the second region of the first surface of the circuit board.

According to this aspect, the recessed sections are provided in the first region and the second region on the first surface of the circuit board. Consequently, since it is possible to further expand the interval between the inertial sensor and the circuit board, the foreign matters much less easily remain.
Third Aspect In the sensor unit according to the first aspect, it is preferable that, in the circuit board, a through-hole piercing through the circuit board is provided in the first region.

According to this aspect, since the through-hole is provided in the first region of the circuit board, it is possible to reduce the remaining of the foreign matters.
Fourth Aspect In the sensor unit according to the first aspect, it is preferable that the second region is provided between the electrode pads adjacent to each other.

According to this aspect, the second region is provided between the electrode pads adjacent to each other. Consequently, the area of the second region coupled to the first region increases. It is possible to further reduce the occurrence of the remaining foreign matters because the cleaning liquid sufficiently spreads.

Fifth Aspect

In the sensor unit according to the first aspect, it is preferable that a peripheral projecting section or an unconnected projecting section is provided between a center of the inertial sensor and the electrode pads in the plan view.

According to this aspect, the peripheral projecting section or the unconnected projecting section is provided between the center of the inertial sensor and the electrode pads. Consequently, it is possible to block, with the projecting section, the foreign matters intruding toward the center of the inertial sensor where the foreign matters tend to remain.

Sixth Aspect

In the sensor unit according to the fifth aspect, it is preferable that the peripheral projecting section or the unconnected projecting section is closer to the electrode pads side than the center side of the inertial sensor.

According to this aspect, the peripheral projecting section or the unconnected projecting section is disposed closer to the electrode pads side than the center side of the inertial sensor. Consequently, the foreign matters less easily reach the center of the inertial sensor where the foreign matters tend to remain.

Seventh Aspect

In the sensor unit according to the fifth aspect, it is preferable that the peripheral projecting section or the unconnected projecting section is an insulating layer.

According to this aspect, the peripheral projecting section or the unconnected projecting section is formed by the insulating layer. Consequently, it is possible to easily form the peripheral projecting section or the unconnected projecting section.

Eighth Aspect

In the sensor unit according to the first aspect, it is preferable that the inertial sensor has a square shape in the plan view, and the plurality of mounting terminals are disposed on an opposed pair of sides of the square shape.

According to this aspect, the mounting terminals of the inertial sensor having the square shape are arrayed on the opposed pair of sides of the square shape. Therefore, it is possible to provide the second region in the directions of the other pair of sides of the inertial sensor on which the mounting terminals are not disposed. Consequently, since the second region having large width can be formed, it is easy to discharge the foreign matters remaining in the gap between the inertial sensor and the circuit board by performing cleaning.

Ninth Aspect

In the sensor unit according to the first aspect, it is preferable that the inertial sensor is an acceleration sensor.

According to this aspect, since the sensor unit includes the acceleration sensor as the inertial sensor, the sensor unit can accurately detect acceleration.

Tenth Aspect

A vehicle positioning device according to this aspect includes: the sensor unit according to any one of the first to ninth aspects; a receiving section configured to receive a satellite signal superimposed with position information from a positioning satellite; an acquiring section configured to acquire the position information of the receiving section on the basis of the received satellite signal; a computing section configured to compute a posture of a vehicle on the basis of inertial data output from the sensor unit; and a calculating section configured to calculate a position of the vehicle by correcting the position information on the basis of the computed posture.

According to this aspect, it is possible to enjoy the effects of the sensor unit according to the invention. The vehicle positioning device having high measurement accuracy of inertia is obtained.

Eleventh Aspect

A portable electronic device according to this aspect includes: the sensor unit according to any one of the first to ninth aspects; a case in which the sensor unit is housed; a processing section housed in the case and configured to process output data from the sensor unit; a display section housed in the case; and a light transmissive cover closing an opening section of the case.

According to this aspect, it is possible to enjoy the effects of the sensor unit according to the invention. The portable electronic device having high measurement accuracy of inertia is obtained.

Twelfth Aspect

In the portable electronic device according to the eleventh aspect, it is preferable that the portable electronic device includes a satellite positioning system and measures a moving distance and a moving track of a user.

According to this aspect, convenience of the portable electronic device is improved.

Thirteenth Aspect

An electronic device according to this aspect includes: the sensor unit according to any one of the first to ninth aspects; and a control section configured to perform control on the basis of a detection signal output from the sensor unit.

According to this aspect, it is possible to enjoy the effects of the sensor unit according to the invention. The electronic device having high measurement accuracy of inertia is obtained.

Fourteenth Aspect

A vehicle according to this aspect includes: the sensor unit according to any one of the first to ninth aspects; and a control section configured to perform control on the basis of a detection signal output from the sensor unit.

According to this aspect, it is possible to enjoy the effects of the sensor unit according to the invention. The vehicle having high measurement accuracy of inertia is obtained.

Fifteenth Aspect

In the vehicle according to the fourteenth aspect, it is preferable that the vehicle includes at least any one system of an engine system, a brake system, and a keyless entry system, and the control section controls the system on the basis of the detection signal.

According to this aspect, it is possible to accurately control at least any one system of the engine system, the brake system, and the keyless entry system.

Sixteenth Aspect

A vehicle according to this aspect includes: the sensor unit according to any one of the first to ninth aspects; and a control section configured to control at least any one of acceleration, braking, and steering on the basis of a detection signal detected by the sensor unit. Whether automatic driving is carried out or not is switched according to a change of the detection signal output from the sensor unit.

According to this aspect, with the control section that controls at least any one of acceleration, braking, and steering, it is possible to accurately switch, according to a change of a detection signal detected by the sensor unit, whether the automatic driving is carried out or not.

Seventeenth Aspect

A display device according to this aspect includes: a display section worn on a head of a user and configured to irradiate image light on eyes of the user; and the sensor unit according to any one of the first to ninth aspects. The sensor unit is located further on one side than a center of the head in a mounted state of the display device.

According to this aspect, in the display device, the sensor unit is located further on one side than the center of the head in the mounted state. Therefore, when the head of the user moves, it is possible to quickly calculate a movement amount, a direction of the movement, and the like in a motion center. It is possible to enjoy the effects of the sensor unit according to the invention. The display device having high measurement accuracy of inertial is obtained.

The entire disclosure of Japanese Patent Application No. 2018-057651 filed Mar. 26, 2018 is expressly incorporated herein by reference.

What is claimed is:

1. A sensor unit comprising:
an inertial sensor including a plurality of mounting terminals;
a circuit board including a first surface;
a plurality of electrode pads on the first surface;
a peripheral projection or an unconnected projection located between a center of the inertial sensor and the electrode pads in a plan view;
connecting members respectively attaching the plurality of electrode pads to the plurality of mounting terminals; and
a case internally housing the circuit board,
wherein the first surface of the circuit board includes:
an insulating layer surrounding each of the plurality of electrode pads in the plan view;
a first region free of the insulating layer, the first region facing a center region of the inertial sensor in the plan view and being inboard of the mounting terminals, and
a second region free of the insulating layer, the second region extending from the first region to an outer side of the inertial sensor in the plan view.

2. The sensor unit according to claim 1, further comprising:
recesses in the first region and the second region of the first surface of the circuit board.

3. The sensor unit according to claim 1, further comprising:
a through-hole piercing through the circuit board in the first region.

4. The sensor unit according to claim 1, wherein the second region extends between adjacent electrode pads among the plurality of electrode pads.

5. The sensor unit according to claim 1, wherein the peripheral projection or the unconnected projection is located closer to the electrode pads than to the center of the inertial sensor.

6. The sensor unit according to claim 1, wherein the peripheral projection or the unconnected projection is an insulator.

7. The sensor unit according to claim 1, wherein
the inertial sensor has a square shape in the plan view, and
the plurality of mounting terminals are disposed on an opposed pair of sides of the inertial sensor.

8. The sensor unit according to claim 1, wherein the inertial sensor is an acceleration sensor.

9. A vehicle positioning device comprising:
the sensor unit according to claim 1;
a receiver configured to receive a satellite signal superimposed with position information from a positioning satellite;
an acquirer configured to acquire the position information of the receiver on the basis of the received satellite signal;
a computator configured to compute a posture of a vehicle on the basis of inertial data output from the sensor unit; and
a calculator configured to calculate a position of the vehicle by correcting the position information on the basis of the computed posture.

10. A vehicle comprising:
the sensor unit according to claim 1; and
a controller configured to control at least any one of acceleration, braking, and steering on the basis of a detection signal detected by the sensor unit, wherein whether automatic driving is carried out or not is switched according to a change of the detection signal output from the sensor unit.

11. A sensor unit comprising:
an inertial sensor including a plurality of mounting terminals;
a circuit board including a first surface;
a plurality of electrode pads on the first surface; and
connecting members respectively attaching the plurality of electrode pads directly to the plurality of mounting terminals;
wherein the first surface of the circuit board includes:
an insulating layer surrounding each of the plurality of electrode pads in a plan view; and
a relief pattern which is devoid of the insulating layer,
wherein the relief pattern includes:
a first well peripherally framed by the plurality of electrode pads and superposed with a center region of the inertial sensor,
a plurality of second wells dispersed circumferentially outboard of the first well, and
a plurality of grooves respectively interconnecting the plurality of second wells and the first well, each groove having a proximal end fluidly communicating with the first well and a distal end fluidly communicating with one of the second wells, and
wherein each of the second wells protrudes beyond a peripheral edge of the inertial sensor in the plan view.

12. The sensor unit according to claim 11, further comprising:
a recess in the first surface of the circuit board within the first well.

13. The sensor unit according to claim 11, further comprising:
a through-hole piercing through the circuit board within the first well.

14. The sensor unit according to claim 11, wherein the grooves extend between adjacent electrode pads among the plurality of electrode pads.

15. The sensor unit according to claim 11, further comprising:
an insulating projection in the first well between a center of the inertial sensor and the electrode pads in the plan view.

16. The sensor unit according to claim 11, wherein
the inertial sensor has a square shape with four corners in the plan view, and
a center of each of the second wells is coincides with one of the corners of the inertial sensor in the plan view.

17. The sensor unit according to claim 11, wherein
the first well has a square shape in the plan view, and
each groove diagonally extends from a corner of the first well.

18. The sensor unit according to claim 11, further comprising:
a case internally housing the circuit board.

19. The sensor unit according to claim 16, wherein the first well has a square shape in the plan view, and each groove diagonally extends from a corner of the first well.

* * * * *